United States Patent
Nakanishi et al.

(10) Patent No.: US 8,194,474 B2
(45) Date of Patent: *Jun. 5, 2012

(54) DATA BUS POWER-REDUCED SEMICONDUCTOR STORAGE APPARATUS

(75) Inventors: Takuya Nakanishi, Tsukuba (JP); Zer Liang, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/194,645

(22) Filed: Jul. 29, 2011

(65) Prior Publication Data

US 2011/0280089 A1 Nov. 17, 2011

Related U.S. Application Data

(63) Continuation of application No. 12/793,069, filed on Jun. 3, 2010, now Pat. No. 8,004,909, which is a continuation of application No. 12/008,564, filed on Jan. 10, 2008, now Pat. No. 7,746,710.

(51) Int. Cl.
*G11C 7/00* (2006.01)
(52) U.S. Cl. ............... 365/189.07; 365/230.03
(58) Field of Classification Search ............. 365/189.07, 365/230.03
See application file for complete search history.

(56) References Cited

U.S. PATENT DOCUMENTS

| | | | |
|---|---|---|---|
| 5,987,244 A | 11/1999 | Kau et al. | 713/500 |
| 6,170,036 B1 * | 1/2001 | Konishi et al. | 711/104 |
| 6,275,503 B1 | 8/2001 | Driscoll | 370/471 |
| 6,301,185 B1 * | 10/2001 | Oowaki | 365/230.03 |
| 6,611,473 B2 | 8/2003 | Al-Shamma et al. | 365/227 |
| 6,859,409 B2 | 2/2005 | Hwang | 365/230.03 |
| 2004/0163028 A1 | 8/2004 | Olarig | 714/767 |
| 2007/0038789 A1 | 2/2007 | Macri et al. | 710/105 |
| 2008/0155150 A1 | 6/2008 | Prete et al. | 710/108 |
| 2009/0180337 A1 | 7/2009 | Nakanishi et al. | 365/189.08 |

FOREIGN PATENT DOCUMENTS

JP 2005-100583 A 4/2005

* cited by examiner

*Primary Examiner* — Michael Tran
(74) *Attorney, Agent, or Firm* — Dorsey & Whitney LLP

(57) ABSTRACT

In one or more of the disclosed embodiments, the number of times toggle operations of a data bus are performed at the time of a data transmission in a semiconductor storage apparatus is reduced, thereby reducing the power consumption. For example, a semiconductor storage apparatus according to one embodiment of the present invention comprises a DRF bus, a DR11F bus, a GDRF bus and a GDR11F bus. The DRF bus and DR11F bus, and the GDRF bus and GDR11F bus, are placed in parallel for the purpose of reducing the number of times toggle operations of a data bus are performed at the time of a data transmission. The DR11F bus is added to make the DRF11F bus perform a toggle operation only when the DRF buses on both sides are made to perform a toggle operation if the data transmission were performed in a conventional system.

24 Claims, 13 Drawing Sheets

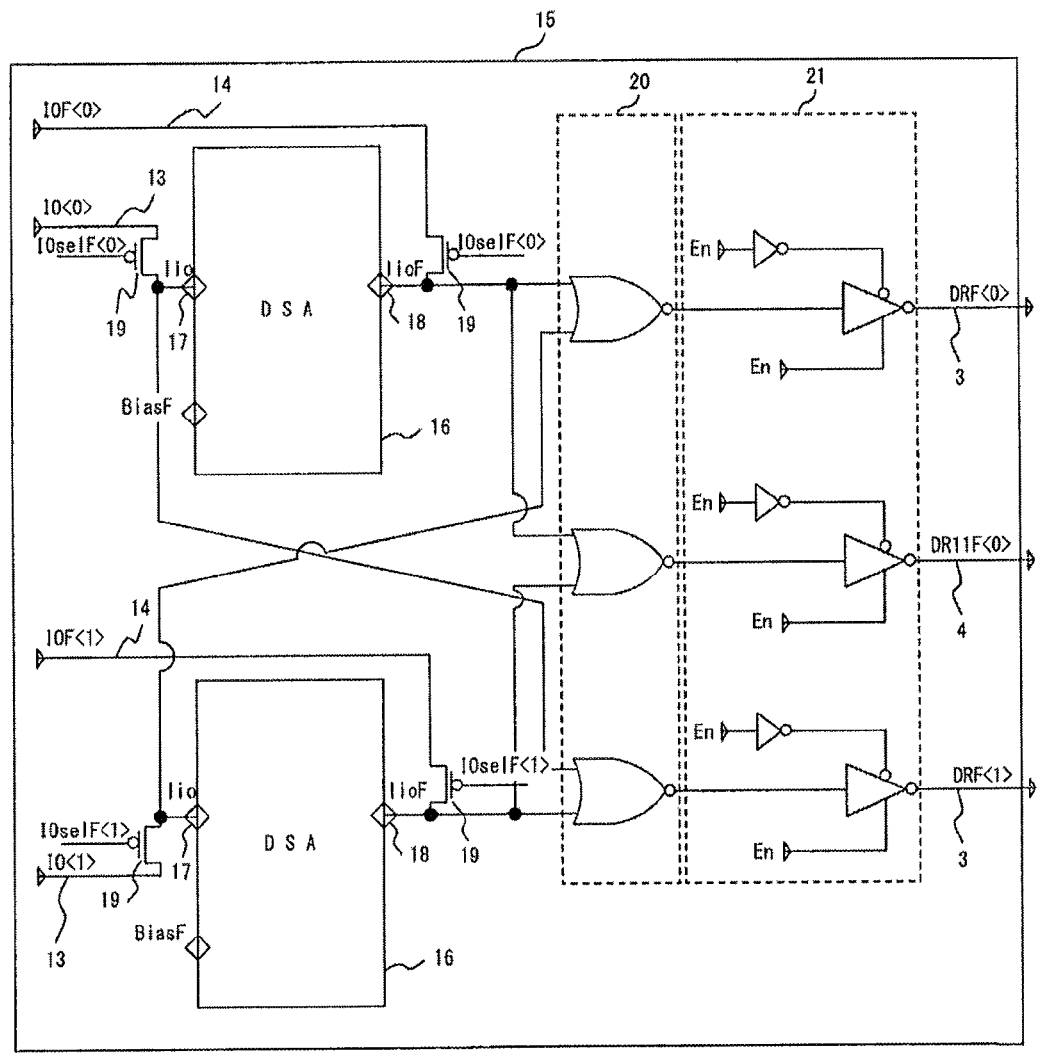
F I G. 3

| IO<1:0> | Conventional scheme DRF<1:0> | Invented method DRF<1:0> | DR11F |
|---|---|---|---|
| 00b | high, high | high, high | high |
| 01b | high, toggle | high, toggle | high |
| 10b | toggle, high | toggle, high | high |
| 11b | toggle, toggle | high, high | toggle |

| | number of toggles | | power reduction |
|---|---|---|---|
| max | 2 (@11b) | 1 (all except for 00b) | 50% |
| average | 1 | 0.75 | 25% |

F I G. 4

| IO⟨3:0⟩ | Conventional scheme DRF⟨3:0⟩ | Invented method DRF⟨3:0⟩ | DR1111F |
|---|---|---|---|
| 0000b | high, high, high, high | high, high, high, high | high |
| 0001b | high, high, high, toggle | high, high, high, toggle | high |
| 0010b | high, high, toggle, high | high, high, toggle, high | high |
| 0011b | high, high, toggle, toggle | high, high, toggle, toggle | high |
| 0100b | high, toggle, high, high | high, toggle, high, high | high |
| 0101b | high, toggle, high, toggle | high, toggle, high, toggle | high |
| 0110b | high, toggle, toggle, high | high, toggle, toggle, high | high |
| 0111b | high, toggle, toggle, toggle | high, toggle, toggle, toggle | high |
| 1000b | toggle, high, high, high | toggle, high, high, high | high |
| 1001b | toggle, high, high, toggle | toggle, high, high, toggle | high |
| 1010b | toggle, high, toggle, high | toggle, high, toggle, high | high |
| 1011b | toggle, high, toggle, toggle | toggle, high, toggle, high | high |
| 1100b | toggle, toggle, high, high | toggle, toggle, high, high | high |
| 1101b | toggle, toggle, high, toggle | toggle, toggle, high, high | high |
| 1110b | toggle, toggle, toggle, high | toggle, toggle, high, high | high |
| 1111b | toggle, toggle, toggle, toggle | high, high, high, high | toggle |

| | number of toggles | | power reduction |
|---|---|---|---|
| max | 4 (@1111b) | 3 (@1110b, 1101b, 1011b, 0111b) | 25% |
| average | 2 | 1.8125 | 9% |

F I G. 6

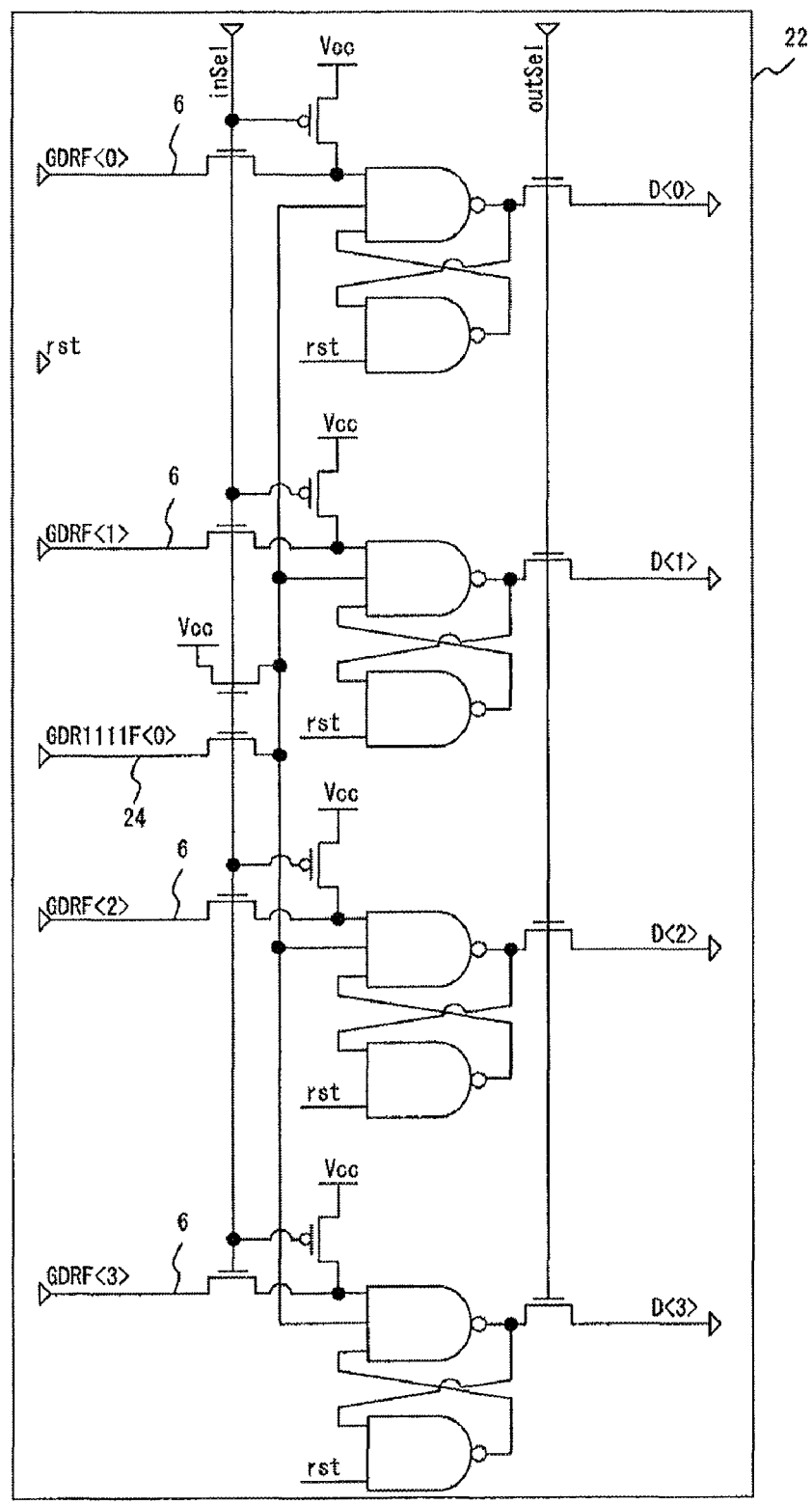
F I G. 8

| IO⟨3:0⟩ | Conventional scheme DRF⟨3:0⟩ | Invented method DRF⟨3:0⟩ | Invented method DR1111F⟨2:0⟩ | |
|---|---|---|---|---|
| 0000b | high, high, high, high | high, high, high, high | high, high, high | |
| 0001b | high, high, high, toggle | high, high, high, toggle | high, high, high | |
| 0010b | high, high, toggle, high | high, high, toggle, high | high, high, high | |
| 0011b | high, high, toggle, toggle | high, high, toggle, high | high, high, toggle | |
| 0100b | high, toggle, high, high | high, toggle, high, high | high, high, high | |
| 0101b | high, toggle, high, toggle | high, toggle, high, toggle | high, high, high | |
| 0110b | high, toggle, toggle, high | high, toggle, toggle, high | high, high, high | |
| 0111b | high, toggle, toggle, toggle | high, toggle, toggle, high | high, high, toggle | |
| 1000b | toggle, high, high, high | toggle, high, high, high | high, high, high | |
| 1001b | toggle, high, high, toggle | toggle, high, high, high | high, high, high | |
| 1010b | toggle, high, toggle, high | toggle, high, toggle, high | high, high, high | |
| 1011b | toggle, high, toggle, toggle | toggle, high, high, high | high, high, toggle | |
| 1100b | toggle, toggle, high, high | high, high, high, high | high, toggle, high | |
| 1101b | toggle, toggle, high, toggle | high, high, high, toggle | high, toggle, high | |
| 1110b | toggle, toggle, toggle, high | high, high, toggle, high | high, toggle, high | |
| 1111b | toggle, toggle, toggle, toggle | high, high, high, high | toggle, high, high | |

| | number of toggles | | | power reduction |
|---|---|---|---|---|
| max | 4 (@1111b) | 2 (@0101b, 0110b, 0111b, 1001b, 1010b, 1011b, 1101b 1110b) | | 50% |
| average | 2 | 1.4375 | | 28% |

F I G. 9

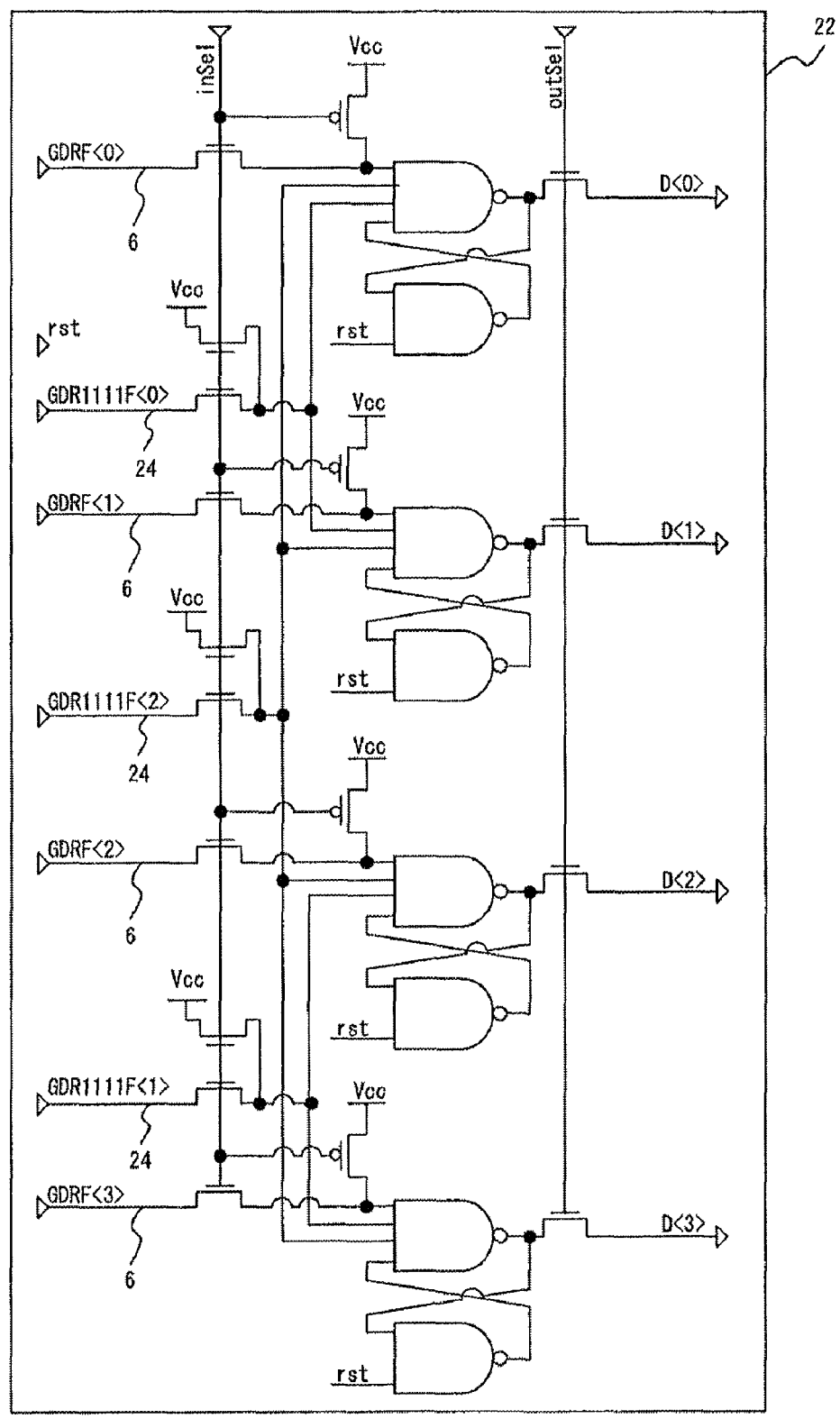
F I G. 11

DATA BUS POWER-REDUCED SEMICONDUCTOR STORAGE APPARATUS

CROSS REFERENCE TO RELATED APPLICATIONS

This application is a continuation of U.S. patent application Ser. No. 12/793,069, filed Jun. 3, 2010, U.S. Pat. No. 8,004,909 B2, which is a continuation of U.S. patent application Ser. No. 12/008,564, filed Jan. 10, 2008, U.S. Pat. No. 7,746,710, which applications and patent are incorporated herein by reference, in their entirety, for any purpose.

TECHNICAL FIELD

The present invention relates to a semiconductor storage apparatus and, in at least one embodiment, particular to a technique for reducing the power consumption thereof.

BACKGROUND

In association with the rapid progress of semiconductor integrated circuit techniques and the higher integration of semiconductor elements, a technological revolution aiming at greater capacities of semiconductor information storage elements that are commonly called memory has been in progress.

What has become a problem associated with greater Dynamic Random Access Memory (DRAM) capacity, reaching up to a gigabyte scale in recent years, is an increase in power consumption when data is being transmitted in the process of performing a read or write operation. One factor in the increase in power consumption result from the elongation of a data bus for transmitting data.

In a common semiconductor storage apparatus, the majority of a chip is occupied by memory cells, resulting in a configuration such that a data bus has to be placed in the peripheral part, thereby resulting in greatly increasing the length of the data bus. Further, associated with a growing chip size in proportion to the capacity of the semiconductor storage apparatus in recent years, the transmission distance of data, that is, the length of the data bus, has tended to become ever longer.

In a semiconductor storage apparatus, data (DQ) buffers that are an interface for data readout and write are arranged integrally in one place within the chip. When transmitting data, the input and output data is detected from a memory cell by way of a sense amplifier and then the data is transmitted to a data sense amplifier through an input/output line. The output of the data sense amplifier is transmitted by way of a local data bus. Further, the local data bus is integrated into a global data bus by a multiplexer at a certain point. As such, the data is transmitted to the DQ buffer by way of the global data bus.

Currently, data transmissions in the Double Data Rate (DDR) system are widely utilized for DRAM, particularly for Synchronous Dynamic Random Access Memory (SDRAM). The DDR system refers to a system of reading or writing continuous data in response to a single read/write command. For example, the number of times continuous data processing is carried out for each system is as follows: two times for DDR, four times for DDR2 and eight times for DDR3. Further, the number of DQ buffers varies from four to eight to sixteen to thirty two, etc., with individual semiconductor storage apparatuses.

As an example, in the case of a semiconductor storage apparatus comprising sixteen DQ buffers transmitting data in the DDR3 system, the continuous data is transmitted to sixteen DQ buffers eight times, and therefore the number of required data buses (i.e., the data bus width) is 128.

Further, when transmitting the data, a toggle operation for the data bus is required. The toggle operation refers to an operation for changing a data bus in a pre-charge state from a certain potential to zero volts. For example, it is supposed that a toggle operation for a data bus is required for transmitting data of "1" and that the pre-charged state needs to be maintained for the data bus for transmitting data of "0". In this case, the semiconductor storage apparatus does not consume power for transmitting data of "0". For transmitting data of "1", however, a series of operations is required in which a toggle operation is used to reduce the potential of the data bus to zero volts, and then the potential is increased to the potential of the pre-charge state once again. If the series of operations is carried out by a large number of very long data buses as described above, the power consumption becomes very large, and this constitutes a major problem in association with the increased capacity of recent semiconductor storage apparatuses.

Accordingly, one prior art technique for reducing the power consumption of a semiconductor storage apparatus utilizes a Current Sense Amplifier (CSA). For example, the data transmitted to a DQ buffer is amplified by using the CSA and VSA (Voltage Sense Amplifier) in order to reduce the power consumption in a data transmission at the semiconductor storage apparatus. Such a utilization of the CSA makes it possible to minimize a difference in potential for transition at the time of performing a toggle operation, thereby enabling a reduction in the power consumption used for a data transmission.

The method, however, has left the following problems. A first problem is that the power consumption of the CSA is large. In some cases, this problem is addressed by reducing the number of CSAs to be placed. However, it is difficult to reduce the power consumption beyond a certain limit using this method.

A second problem is low noise resistance. Noise resistance is reduced as the distance of a transmission increases, and this requires that a current with a larger difference in potential be applied. That is, when applying it to a large capacity device on which a long distance data transmission is required, then a recognized problem is difficulty in reducing the power consumption.

BRIEF DESCRIPTION OF THE DRAWINGS

The embodiments of the present invention will be more apparent from the following detailed description when the accompanying drawings are referred to.

FIG. 3 is a diagram showing an embodiment of a data sense amplifier unit containing an encode unit that can be used in the semiconductor storage apparatus embodiment shown in FIG. 1.

FIG. 4 is a diagram showing data transmitted in, and power consumption of a semiconductor storage apparatus according to the embodiment shown in FIG. 1.

FIG. 6 is a diagram showing data transmitted in, and power consumption of, a semiconductor storage apparatus according to another embodiment of the present invention.

FIG. 8 is a diagram showing an embodiment of a decode unit that may be used in the latch multiplexer unit in the semiconductor storage apparatus shown in FIG. 1 or FIG. 12.

FIG. 9 is a diagram showing data transmitted in, and power consumption of, a semiconductor storage apparatus according to another embodiment of the present invention.

FIG. 11 is a diagram showing an embodiment of a decode unit that may be used in the latch multiplexer unit in the semiconductor storage embodiment shown in FIG. 1 or FIG. 12.

DETAILED DESCRIPTION

Figure 1:
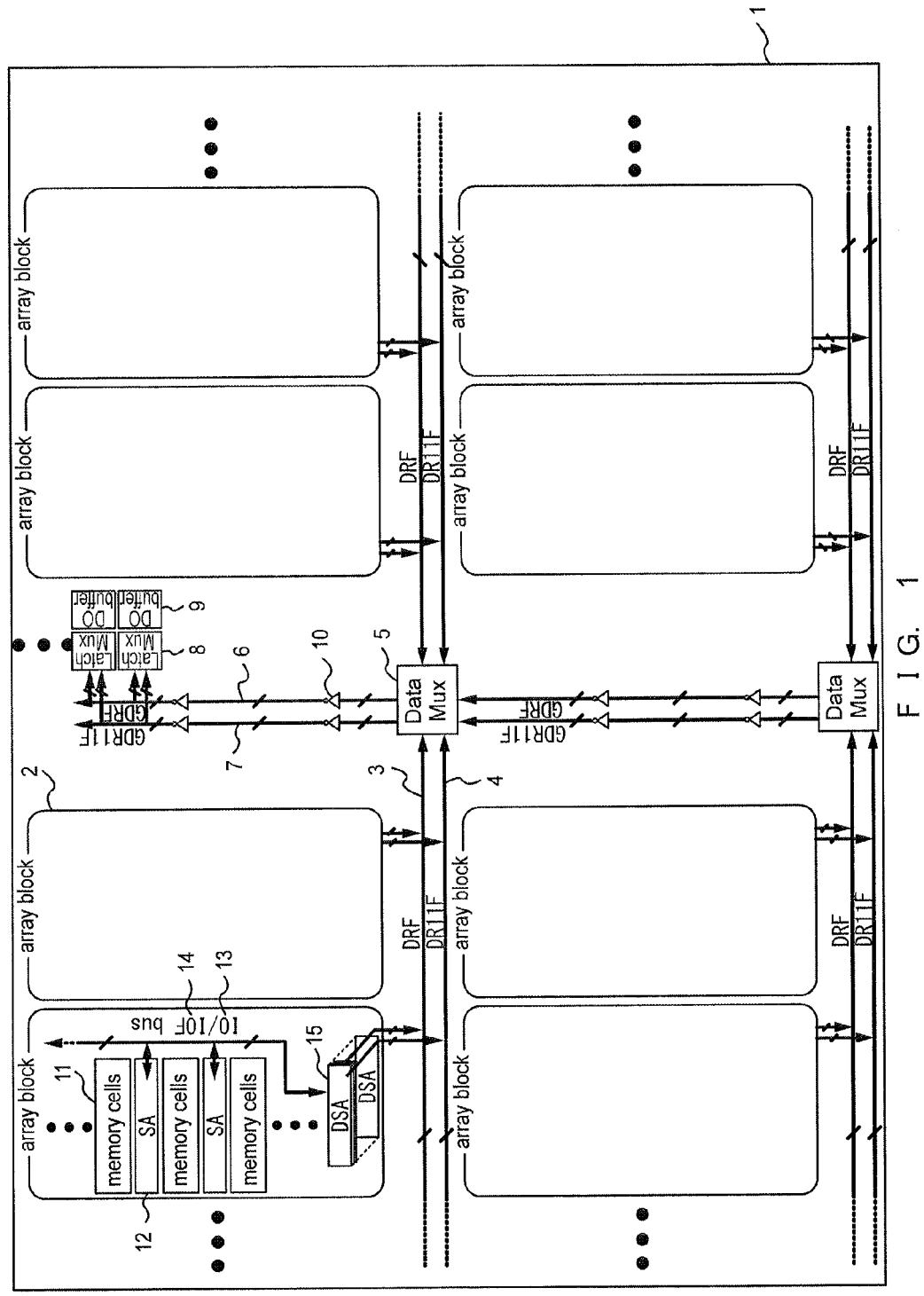
FIG. 1 is a block diagram of a semiconductor storage apparatus according to an embodiment of the present invention.

FIG. 1 is a block diagram of a semiconductor storage apparatus according to an embodiment of the present invention. The semiconductor storage apparatus includes an array block 2, a DRF (Data Read False) bus 3, a DR11F bus 4, a data multiplexer unit (Data Mux) 5, a GDRF (Global Data Read False) bus 6, a GDR11F bus 7, a latch multiplexer unit (Latch Mux) 8 and a DQ buffer unit 9.

The semiconductor storage apparatus 1 comprises, as an example, a plurality of array blocks 2, with each array block 2 comprising one or more memory cell units (memory cells) 11, sense amplifier (SA) units 12, an Input/Output (IO) bus 13, an Input/Output False (IOF) bus 14, and a data sense amplifier (DSA) unit 15. Further, memory cell unit 11 comprises one or more memory cells.

Figure 2:
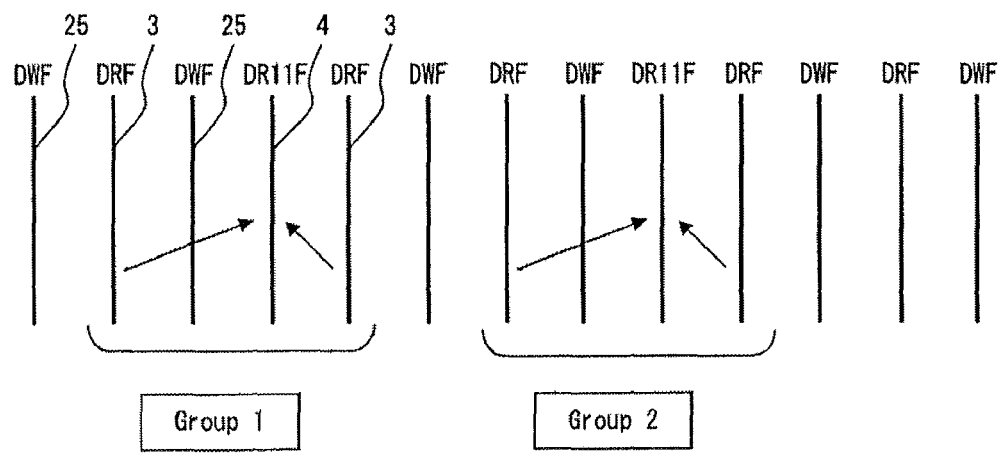
FIG. 2 is a diagram showing a placement of data buses of a semiconductor storage apparatus according to the embodiment shown in FIG. 1.

FIG. 2 is a diagram showing a placement of data buses of a semiconductor storage apparatus according to the embodiment of FIG. 1.

As shown in FIG. 2, the DRF bus 3, which is a first readout bus, and the DR11F bus 4, which is a second readout bus, are placed in parallel with each other. The DR11F bus 4 is a bus used for a data readout that is added anew for the purpose of reducing the number of times data bus toggle operations must be performed at the time of a data transmission following a conversion of first data into second data.

One line of the DR11F bus 4 is added for, and between, the two DRF buses 3. As described later, the configuration is such as to make the DR11F bus 4 perform a toggle operation only if the DRF buses 3 on both sides would be required to perform a toggle operation if the data transmission were performed in the conventional system. In this event, the configuration is such as to make the DRF buses 3 on both sides not perform a toggle operation which they would have conventionally performed.

Likewise, as to the GDRF bus 6, one additional GDR11F bus 7 is placed for, and between, the two GDRF buses 6. The configuration is also such as to make the GDR11F bus 7 perform a toggle operation only if the GDRF buses 6 on both sides would be required to perform a toggle operation if the data transmission were performed in the conventional system. In this event, the configuration is such as to make the GDRF buses 6 on both sides not perform a toggle operation which they would have conventionally performed.

Referring to FIG. 1, first, data is read from the array block 2 and eventually transmitted to the latch multiplexer unit 8 and DQ buffer unit 9. In this event, signals transmitted through the DRF bus 3 and DR11F bus 4 are integrated by way of the data multiplexer unit 5, and are then transmitted to the latch multiplexer unit 8 by way of the GDRF bus 6 and GDR11F bus 7, respectively. The transmitted data is latched and then output by the latch multiplexer unit 8 after waiting for the latency period of the semiconductor storage apparatus. As such, the data is eventually transmitted to the DQ buffer unit 9 that is an input/output interface.

The latch multiplexer unit 8, also called a pipe, may be considered to perform the role of a combination between a multiplexer and First-In First-Out (FIFO) memory. That is, in the case of a semiconductor storage apparatus comprising sixteen DQ buffer units and transmitting data in the DDR 3 system, 128-bit data is transmitted at once. The latch multiplexer unit 8 has the function of latching, and temporarily storing, the data, followed by outputting it in a certain sequence (i.e., the sequence of burst transfer) after waiting for the latency period of the semiconductor storage apparatus. Here, the latency period refers to a delay time starting from the request for a data output to the actual output.

Note that the number of the DQ buffer unit 9 comprised by the semiconductor storage apparatus 1 according to the embodiment of the present invention varies with the semiconductor storage apparatus, with the number expressed as x8, x16, x32 and such. An example case of an x8 device indicates that eight of the DQ buffer units 9 are placed in the semiconductor storage apparatus.

Here, the DRF bus 3 and DR11F bus 4 are also called local data read buses.

Next is a description of the meaning of "F" of the DRF bus 3, DR11F bus 4, GDRF bus 6 and GDR11F bus 7, which is "False".

In the event of a data readout, the individual bus is put in the state of being pre-charged at a certain potential indicating the state of "1" as the standard (i.e., standby) state. If the state of the bus shifts from the pre-charge state represented by "1" to a potential (of zero volts) indicating the state of "0", that is, if a toggle operation is detected, the bus is supposed to have transmitted data of "1" (sometimes noted as "'1' data' hereinafter). That is, the "F", meaning "False", is affixed to a bus defined as transmitting inverted data, as opposed to the bus of "True" which is defined as transmitting data of "0" (sometimes noted as '0" data' hereinafter) in the case of detecting a toggle operation.

Note that the present embodiment is described as the DRF bus 3, DF11F bus 4, GDRF bus 6 and GDR11F 7 bus transmitting data, which is arbitrary, and the DR bus, DR11bus, GDR bus and GDR11 bus, which are "True" buses, may transmit data.

Figure 5:
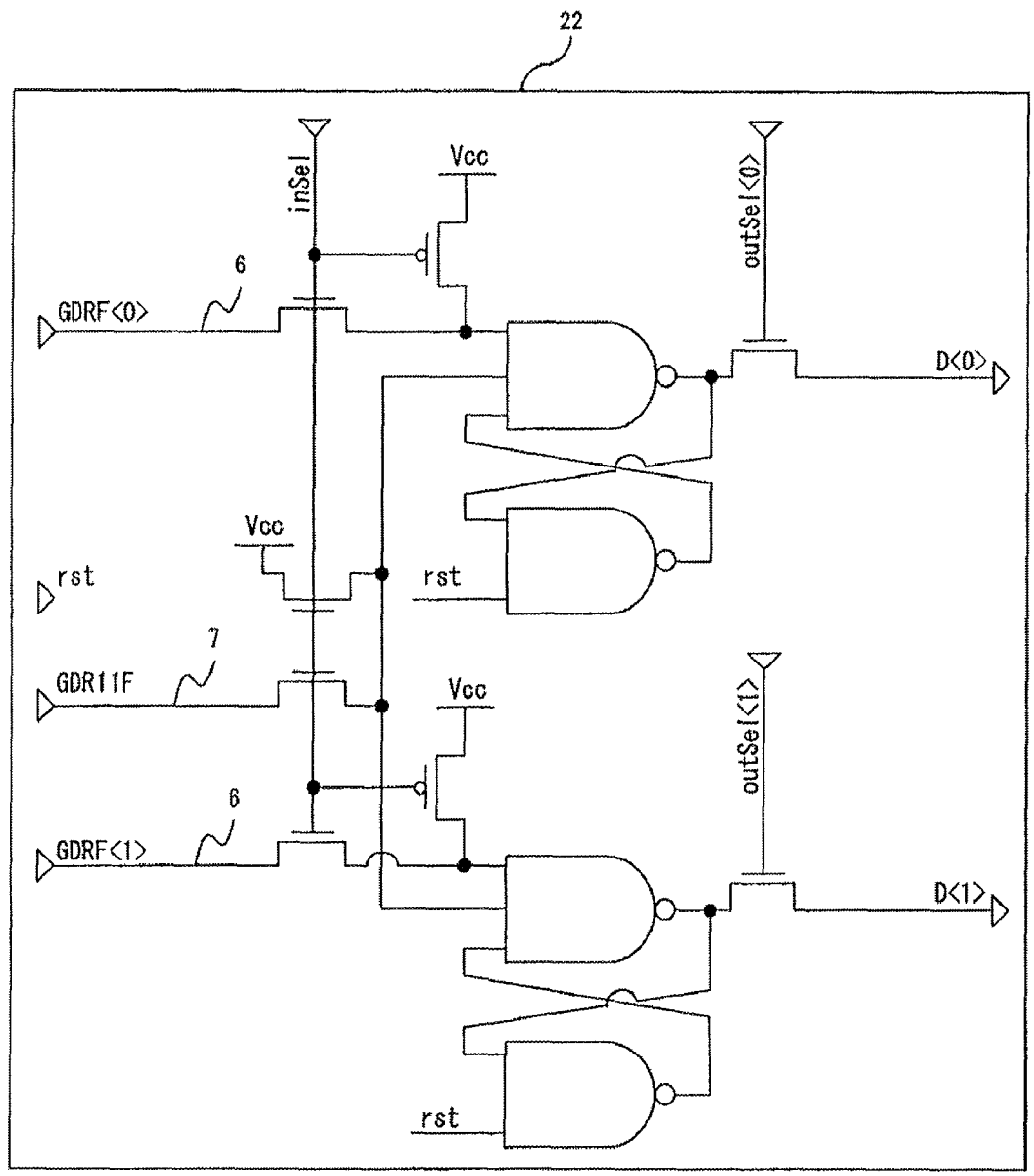
FIG. 5 is a diagram showing an embodiment of a decode unit that may be used in the latch multiplexer unit in the semiconductor storage apparatus shown in FIG. 1 or FIG. 12.

Further, inverters 10 are connected to the GDRF bus 6 and GDR11F bus 7. In this configuration, a shaping of a data waveform is required in the event of transmitting readout data over a long distance. That is, the inverter 10 has the function of a buffer for data. If the number of inverter 10 that is placed respectively on the GDRF bus 6 and GDR11F bus 7 is even, a post-transmission waveform remains in the state of being read out. In contrast, if the number of inverter 10 that is placed thereon is odd, the post-transmission waveform will be in an inverted state. Therefore, a certain modification is required, such as, for example, constituting a decode unit 22 (refer to FIG. 5), which is an interface part of the latch multiplexer unit 8, by a NOR circuit. That is, the circuit of the decode unit 22 shown in FIG. 5 is just an example, which may be modified so as to perform a desired operation.

The data multiplexer unit 5 has the function of integrating a plurality of DRF buses 3 into the GDRF bus 6 and further integrating a plurality of DR11F buses 4 into the GDR11F bus 7. As an example, if the data bus on an output side is in the pre-charged state at the time of a standby state, the data multiplexer unit 5 is only required to shift the data bus to "0" volts (i.e., the state of indicating "0" data) for transmitting "1" data. Therefore, the data multiplexer unit 5 can easily be implemented by combining a NAND circuit with an inverter circuit, for instance.

FIG. 3 is a diagram of a data sense amplifier unit 15 according to one embodiment that includes an encode unit 20 of a semiconductor storage apparatus that may be used in the semiconductor storage apparatus embodiment of FIG. 1. The encode unit 20 is connected to a data sense amplifier block 16, and it has the function of encoding so as to reduce the number of times toggle operations of a data bus must be performed. Further, a data sense amplifier selection unit 21 is connected to the encode unit 20. The data sense amplifier selection unit 21 has the function of putting the connection part between the DRF bus 3 and encode unit 20 at a high impedance, by receiving a control by way of an enable signal (En) from a state machine (not shown in a drawing herein) so as not to connect the unused data sense amplifier block 16 and encode unit 20 to the DRF bus 3.

The following is a description of a data readout operation in detail by referring to FIGS. 1 through 3.

When a read command is given after an input of an active command that activates the sense amplifier units 12 from the state machine to the semiconductor storage apparatus 1, data is read from a memory cell selected by a word line and a column select line within the memory cell unit 11 of an array block 2.

A memory cell can be comprised of one transistor and one capacitor for example, with a word line connected to the gate and a bit line connected to the drain of the transistor, and the configuration includes an array of memory cells.

Here, as an example, the assumption is that the state of accumulating a charge in the capacitance is defined as the memory cell storing "1" data, while that of not accumulating a charge in the capacitance is defined as the memory cell storing "0" data.

For the sense amplifier unit 12 detecting data (i.e., first data) stored in the memory cell, first the potential of the word line connected to the selected memory cell is raised by an input of an active command, thereby putting the transistor of the memory cell in a conductive state. This prompts the charge accumulated in the capacitance of the memory cell to be discharged to the bit line if data of "1" is stored, and the potential of the bit line is increased slightly from a reference voltage as a result. In contrast, if data of "0" is stored, the charge accumulated in the bit line is discharged to the capacitor of the memory cell. As a result, the potential of the bit line is decreased slightly from the reference voltage. The sense amplifier unit 12 detects, and amplifies, a minute change in potentials of the bit line by using a Vcc/2 as the reference voltage, where the Vcc is the power supply voltage. Note that the reference voltage utilizes the potential of an unselected bit line. The potential of the bit line utilized as the reference voltage and the potential of a selected bit line are input into the sense amplifier unit 12 as described above, and the difference in potentials is amplified.

As described above, when an active command for detecting data is input from the state machine, the state machine allows an input of a read command after an elapsed time of a few to over ten nanoseconds. During the wait time, the sense amplifier unit 12 amplifies the data detected as a minute change in potentials to make it a complete split state of "1" or "0". The read command is a command that performs a data read-out operation by an input of a column select signal.

An input of a column select signal in this state applies a voltage to the gate of a column select transistor, putting it in the conductive state, and outputs the data amplified by the sense amplifier 12 to the IO bus 13 and IOF bus 14. In the column select transistor, a column select signal line is connected to the gate, and either the bit line or IO bus 13 (or the IOF bus 14) is connected to either the drain or source. The IO bus 13 and IOF bus 14, as two lines, are configured as one pair of differential buses, and are pre-charged to the potential of Vcc in the standby state. The potential of either the IO bus 13 or IOF bus 14, one of which is connected to one bit line on which data of "0" is detected by the sense amplifier units 12 (that is, on which the potential descends to zero volts), descends simultaneously with the input of a column select signal. The descent of the potential is detected by the data sense amplifier unit 15, which is further followed by performing a data transmission.

Here, the differential system is one of the drive systems for a data bus and refers to a method for transmitting data in two signal lines, i.e., True and False lines. For instance, if the voltage of a True signal line is higher than that of the voltage of the False signal line, a transmission of data of "1" is enabled, whereas if the voltage is lower, the transmission of data of "0" is enabled. In contrast, the conventional single end system transmits data of "1" and "0" on one signal line in accordance with the state thereof. While the differential system is high in cost because of a more complex mechanism than the single end system, the former requires no provision of a reference potential by grounding and has the characteristic of a signal not being attenuated.

As described above, the input of a column select signal decreases the potential of one bus, in which data of "0" is detected by the sense amplifier units 12 of the IO bus 13 and IOF bus 14, and therefore the data sense amplifier unit 15 further amplifies the descent of the potential. That is, the data sense amplifier unit 15 receives the inputs of data from the IO bus 13 and one from IOF bus 14 and, if a descent of the potential of the bus in which the transmission of data of "0" is transmitted is detected, it allocates "0" to a node connected to the bus in which the potential has descended to "0" and allocates "1" to the other node of a Local Input/Output (LIO) node 17 and a Local Input/Output False (LIOF) node 18. Although either "1" or "0" is already detected in the IO bus 13 or IOF bus 14 at the time of a data input into the data sense amplifier unit 15, it takes a long time for the potential of the bus in the "0" state, of the two buses, to descend completely to "0" volts. Therefore, sensing with the data sense amplifier unit 15 at the time of either one bus descending to a certain level and allocating data to the LIO node 17 and LIOF node 18 make it possible to detect data at a high speed. At this point, the readout data is converted into a form of enabling a transmission on the signal line of the single end system.

In practice, the IO bus 13 and IOF bus 14 are connected to a large number of sense amplifier units 12 by way of a large number of column select transistors and therefore are long and have large loads. Accordingly, a transistor 19 equipped on the input side of the data sense amplifier unit 15 is put in a turnoff state by the control of an IOself signal, thereby shutting off data input at the time of a potential difference occurring between the IO bus 13 and IOF bus 14. This shuts off the load on the IO bus 13 and IOF bus 14, enabling the data sense amplifier unit 15 to operate at a high speed. After going through the data sense amplifier unit 15, the data is converted into the form of "1" and "0", allowing a transmission on a bus of the single end system.

The semiconductor storage apparatus 1 is characterized as converting the first data into second data when the first data is transmitted on the DRF bus 3 and GDRF bus 6 of the single end, thereby reducing the number of toggle operations of the buses.

Next is a description on the toggle operation of a bus by referring to FIG. 3. Whether the data after going through the data sense amplifier unit 15 is "1" or "0" is expressed by correlation with the potential of either the IO bus 13 (i.e., the LIO node 17) or IOF bus 14 (i.e., the LIOF node 18) being Vcc (i.e., "1") or "0" volts (i.e., "0"). When the data is transmitted on the DRF bus 3, if the IO bus 13 (i.e., the LIO node 17) is "0", the DRF bus 3 is connected to the LIOF node 18, and therefore the "1" data is transmitted, thereby maintaining the potential of the bus at the Vcc (i.e., a High state). On the other hand, if the IO bus 13 (i.e., the LIO node 17) is "1", then the DRF bus 3 transmits the "0" data, resulting in shifting the potential of the DRF bus 3 to zero volts (i.e., a Low state) from Vcc. This shift is defined as a toggle operation. In other words, a toggle operation of LIOF node 18, which is an output of the data sense amplifier block 16, corresponds to the toggle operation of the DRF bus 3.

Here, when "1" data is transmitted to the DRF bus 3, the potential thereof is maintained at the High state, thereby making it possible to transmit information without consuming any power at all.

If, however, "0" data is transmitted to the DRF bus 3, that is, if the IO bus 13 (i.e., the LIO node 17) is "1", a toggle operation of the DRF bus 3 occurs, followed by the performance of an operation of returning the potential of the DRF bus 3 to the Vcc (i.e., the High state) in preparation for the next readout operation.

The reason this occurs is that the IO bus 13 and IOF bus 14 need to be pre-charged so as to make the potential be Vcc (i.e., the High state) in preparation for the next readout operation.

The re-climbing of the potential to a pre-charge state after the toggle operation is carried out in not only the set of the IO bus 13 and IOF bus 14 that is the differential system but also in the set of DRF bus 3 and GDRF bus 6 that is the single end system. Therefore, the data is transmitted for a long distance from the data sense amplifier unit 15 to the latch multiplexer unit 8, and moreover a large number of the DRF buses 3 and GDRF buses 6 are made to perform toggle operations, followed by re-increasing the potential, resulting in the semiconductor storage apparatus consuming a large amount of power.

Accordingly, the semiconductor storage apparatus according to one or more embodiments of the present invention is configured to implement a conversion into second data as shown in FIG. 4 by employing an encoding unit shown in FIG. 3, thereby accomplishing a reduction in the power consumption at the time of a data transmission.

FIG. 4 is a diagram showing data transmitted in, and power consumption of, a semiconductor storage apparatus according to an embodiment of the present invention.

The IO<1:0> refers to the data input into the IO bus 13. The 1:0 means a total of two bits from the first bit to the zeroth bit. When the data input into the IO bus 13 is transmitted on the DRF bus 3, the state of the potential of the DRF bus 3 (i.e., a High state or a toggle operation) is shown by FIG. 4.

First, having received an input of "0" to the IO bus 13, the DRF bus 3 maintains a High state, while having received an input of "1" to the IO bus 13, the DRF bus 3 needs a toggle operation to be performed in the conventional semiconductor storage apparatus as described above. Because of this, the maximum number of times toggle operations can be performed for one data transmission is two in the case of transmitting the data of "11b". Further, the total number of times toggle operations can be performed is four in the event of transmitting four kinds of data, and therefore the average number of times toggle operations can be performed in a data transmission is one time (i.e., 4 times/4 kinds).

In contrast, the semiconductor storage apparatus 1 is configured to place the DR11F bus 4 in parallel with the DRF bus 3 so that the DRF bus 3 and DR11F bus 4 perform a toggle operation as explained below.

As shown in FIG. 2, the DR11F bus 4 is placed between the two DRF buses 3. Here, the DR11F bus 4 is made to perform a toggle operation only if the DRF buses 3 on both sides would be required to perform toggle operations if the data transmission were performed in a conventional system. In this event, the two DRF buses 3, which would have conventionally been required to perform a toggle operation, are configured to not perform it at all.

That is, the configuration is such that, if only the data of "11b" is input into the IO bus 13, the DR11F bus 4 is made to perform a toggle operation, otherwise the High state is maintained for the DR11F bus 4. Meanwhile, if the data of "11b" is input into the IO bus 13, the DRF bus 3 is configured not to perform a toggle operation, while the operation is the same as that of the conventional system if the data of "00b", "01b" and "10b" are input into the IO bus 13. Instead, the DR11F bus 4 is configured to perform a toggle operation if the data of "11b" is input into the IO bus 13.

Making the DRF bus 3 and DR11F bus 4 perform the toggle operation causes the maximum toggle times in one data transmission to be one time in the case of transmitting the data of "01b", "10b" and "11b". The total number of times toggles are performed in the event of transmitting four kinds of data is three, and therefore the average number of toggle times is 0.75 times (i.e., 3 times/4 kinds). That is, the semiconductor storage apparatus 1 reduces the maximum toggle times from two times to one time for one data transmission and therefore is capable of reducing the power consumption by 50% at the maximum power.

Further, the semiconductor storage apparatus 1 according to the first embodiment of the present invention reduces the average number of toggle times from one time to 0.75 times and therefore is capable of reducing the power consumption by 25% at the average power.

Note that the GDRF bus 6 and GDR11F bus 7 are placed in the same manner as the DRF bus 3 and DR11F bus 4 and transmit data in the same manner.

Next is a description of a method for implementing such a toggle operation by referring to FIG. 3.

The encode unit according to the first embodiment of the present invention can be implemented by connecting NOR circuits, as shown in FIG. 3 as an example. The circuit shown in FIG. 3 is just an example and can be freely modified so as to perform a desired operation. The encode unit shown in FIG. 3 performs a conversion so that the number of toggle operations performed in a transmission of a second data is smaller than the number of toggle operations performed in a transmission of a first data, and also transmits the second data through DRF bus 3 and DR11F bus 4.

The outputs of three NOR circuits, i.e., a circuit each on the top row, middle row and bottom row, are respectively connected to the DRF<0> that is the zeroth bit (the first line) of the DRF bus 3, to the DR11F<0> that is the zeroth bit of the DR11F bus 4, and to the DRF<1> that is the first bit (the second line) of the DRF bus 3.

First is a description of an operation of the NOR circuit on the top row of the drawing. The NOR circuit on the top row receives an input of the zeroth bit (the first line), i.e., LIOF<0>, of the IOF bus 14 (i.e., the LIOF node 18) and that of the first bit (the second line), i.e., LIO<1>, of the IO bus 13 (i.e., the LIO node 17). The IO<0> and IO<1> shown in FIG. 3 correspond to the IO<1:0> shown in FIG. 4.

As a result, if the LIO<1> is "0", the zeroth bit output (i.e., zeroth bit output of the LIOF) of the IOF bus 14, that is, a toggle operation corresponding to "0", or a High state corresponding to "1" is transmitted as is to the DRF bus 3. That is, the DRF bus 3 is made to perform a toggle operation if the IOF bus 14 is "0", while the DRF bus 3 is maintained at the High state if the IOF bus 14 is "1".

In contrast, in the case of the LIO<1> being "1", the DRF bus 3 is maintained for the High state regardless of the IOF bus 14 being "0" or "1". That is, the information expressed by a toggle operation is not transmitted.

This configuration makes it possible to make the DRF bus 3 perform a toggle operation if data of "01b" is input into the IO bus 13, and makes the DRF bus 3 not perform a toggle operation if the data of "00b", "10b" and "11b", i.e., the data other than "01b", are input into the IO bus 13.

Next is a description of an operation of the NOR circuit on the bottom row. The NOR circuit on the bottom row receives an input of the first bit (the second line), i.e., LIOF<1>, of the IOF bus 14 (i.e., the LIOF node 18) and the zeroth bit (the first line), i.e., LIO<0>, of the IO bus 13 (i.e., the LIO node 17).

As a result, if the LIO<0> is "0", the first bit output of IOF bus 14 (i.e., the output of the LIOF<1>) is transmitted as is to the DRF bus 3. That is, if the IOF bus 14 is "0", the DRF bus 3 is made to perform a toggle operation, while if it is "1", the DRF bus 3 is maintained at the High state. In contrast, if the LIO<0> is "1", the DRF bus 3 is maintained at the High state regardless of the IOF bus 14 being "0" or "1". That is, the DRF bus 3 is not made to perform a toggle operation. This configuration makes it possible to have the DRF bus 3 perform a toggle operation if the "10b" is input into the IO bus 13, and to have the DRF bus 3 not perform a toggle operation if the "00b", "10b" and "11b", i.e., the data other than "01b", are input into the IO bus 13.

Next is a description of the NOR circuit inn the middle row of FIG. 3. The NOR circuit in the middle row receives an input of the zeroth bit (the first line), i.e., LIOF<0>, of the IOF bus 14 (i.e., the LIOF node 18) and that of the first bit (the second line), i.e., LIOF<1>, of the IOF bus 14 (i.e., the LIOF node 18). This results in making the DR11F bus 4 perform a toggle operation only if "0" is input into both of the LIOF<0> and LIOF<1>, thus needing to have the DR11F bus 4 perform the toggle operation. This configuration makes it possible to have the DR11F bus 4 perform a toggle operation if "11b" is input into the IO bus 13.

The configuration and operation of the encode unit 20 shown in FIG. 3 as described above make it possible to implement a conversion of the data as shown in FIG. 4 and to reduce the number of times toggle operations of a bus are performed at the time of a data transmission. Therefore, it is possible to accomplish a reduction in the power consumption of the semiconductor storage apparatus.

Further, the encode unit 20 comprised by the semiconductor storage apparatus 1 does not have an increased number of gate stages as compared to the conventional encode unit. That is, the conventional encode unit is configured such that the NOR circuit part of FIG. 3 is replaced with an inverter circuit, whereas, compared with the conventional encode unit, the encode unit 20 according to the first embodiment of the present invention does not have an increased number of gate stages. Therefore, the encode unit 20 is characterized as having no penalty in terms of speed as compared to conventional data transmission and as allowing no delay in the transmission speed.

Next is a description of a method for decoding data transmitted by way of the DRF bus 3, DR11F bus 4, GDRF bus 6 and GDR11F bus 7 by referring to FIG. 5.

FIG. 5 is a diagram showing a decode unit 22 of the semiconductor storage apparatus 1. The circuit shown in FIG. 5 is just an example, and it can be changed freely so as to perform a desired operation.

The data output from the data sense amplifier block 16 within the data sense amplifier unit 15 of the array block 2 is encoded as shown in FIG. 4 by way of the encode unit 20 and data sense amplifier selection unit 21 as described above, and is transmitted to the DRF bus 3 and DR11F bus 4. Then, the data is transmitted to the GDRF bus 6 and GDR11F bus 7 by way of the data multiplexer unit 5. The data transmitted as such is finally received at the latch multiplexer unit 8, and further sent to the DQ buffer unit 9.

The decode unit 22 shown in FIG. 5 is included in the latch multiplexer unit 8.

The decode unit 22 comprised by the semiconductor storage apparatus 1 has the function of decoding, i.e., converting the second data that is encoded by the encode unit 20 and transmitted by way of the DRF bus 3, DR11F bus 4, GDRF bus 6 and GDR11F bus 7 into data of the original state (the first data, i.e., the data prior to being encoded). The decode unit 22 also has a function of latching and outputting the data.

The data of the GDRF bus 6 and GDR11F bus 7 is input into a NAND flip-flop circuit (a latch circuit) as shown in FIG. 5.

First, the NAND flip-flop circuit on the upper row receives an input of the zeroth bit (the first line), i.e., GDRF<0>, of the GDRF bus 6 and that of the zeroth bit, i.e., GDR11F<0>, of the GDR11F bus 7. Of them, when the GDR11F<0> is in a High state, the data is output by transmitting the information expressed by the toggle operation if the GDRF<0> is a toggle operation. In contrast, when the GDR11F<0> is a toggle operation, the data is output by transmitting the information expressed by the toggle operation regardless of the state of the GDRF<0>.

That is, if at least either the GDRF<0> or GDR11F<0> is "0", the data is output by transmitting the state expressed by the toggle operation. In this event, the output side of D<0> of the decode unit 22 uses the True side in place of the False side as output and therefore the D<0> is "1" if the state expressed by the toggle operation is transmitted.

Meanwhile, the NAND flip-flop circuit on the lower row receives the input of the first bit (the second line), i.e., GDRF<1>, of the GDRF bus 6 and that of the zeroth bit, i.e., GDR11F<0>, of the GDR11F bus 7. Of them, when the GDR11F<0> is in the high state, the data is output by transmitting the information expressed by the toggle operation if the GDRF<1> is a toggle operation. In contrast, when the GDR11F<0> is a toggle operation, then the data is output by transmitting the information expressed by the toggle operation regardless of the state of the GDRF<1>.

That is, when at least either the GDRF<1> or GDR11F<0> is "0", the data is output by transmitting the state expressed by the toggle operation. In this event, the output side of D<0> of the decode unit 22 uses the True side in place of the False side as an output and therefore the D<0> is "1" if the state expressed by the toggle operation is transmitted.

Performing the operation as described above makes it possible to convert the data transmitted by way of the DRF bus 3, DR11F bus 4, GDRF bus 6 and GDR11F bus 7 into the state expressed by the toggle operation prior to the encoding.

In reality, a large number of pieces of data are transmitted to the GDRF bus 6 and GDR11F bus 7 at once. As an example, in the case of transmitting data using a DDR3 system comprising sixteen of the DQ buffer units 9, the data of 128 bits is transmitted at once. Therefore, an operation is required for temporarily storing (i.e., latching) the large number of pieces of data and outputting them after an elapse of a certain number of clock counts that depend on the latency period of the semiconductor storage apparatus.

The semiconductor storage apparatus 1 is configured to input a control signal called "inSel" from the state machine into the decode unit 22, and thereby to perform a latching of data, and input a control signal called "Outsel", thereby outputting the data. Accordingly, the decode unit 22 shown in FIG. 5 is comprising a NAND flip-flop circuit for latching the data.

It is also configured to input a control signal called "rst", meaning resetting data, thereby performing the operation of resetting the latched data.

The decode unit 22 comprised by the semiconductor storage apparatus 1 does not have an increased number of gate stages as compared to the conventional decode unit. That is, the conventional decode unit is configured to have two inputs of the NAND constituting the NAND flip-flop circuit shown in FIG. 5. Comparably, the decode unit 22 according to the first embodiment of the present invention is configured differently to have three inputs of the NAND, whereas the number of gate stages is not increased. Therefore, the decode unit 22 is characterized as having no speed penalty and having no delay in the transmission speed occur, in contrast to the conventional data transmission.

Note that the semiconductor storage apparatus 1 is described by exemplifying the SDRAM, which is arbitrary and may be another volatile semiconductor storage apparatus such as DRAM and SRAM (Static Random Access Memory), for example.

It may also be a nonvolatile semiconductor storage apparatus such as flash memory, EEPROM (Electrically Erasable Programmable Read Only Memory), UVEPROM (Ultra-Violet Erasable Programmable Read Only Memory), FeRAM (Ferroelectric Random Access Memory) and MRAM (Magnetoresistive Random Access Memory) for example.

Further, the data may be transmitted by, for example, utilizing a DDR (Double Data Rate) system or some other system.

Further, the first embodiment of the present invention is configured to place the DR11F bus in parallel with the DRF bus, and to place the GDR11F bus in parallel with the GDRF bus, in order to reduce the number of times toggles are performed for all data buses for transmitting data, thereby reducing the power consumption; an example alternative configuration, however, may be to reduce the number of times toggles are performed in the part of the DRF bus and DR11F bus, thereby reducing the power consumption. Further alternatively, the number of times toggles are performed may be reduced partially in the part of the GDRF bus and GDR11F bus by modifying the data multiplexer unit, thereby reducing the power consumption.

Further, the semiconductor storage apparatus 1 is described by exemplifying the case of transmitting data by way of the DRF bus and GDRF bus, which is arbitrary, and an alternative configuration may be to transmit data by using the DR bus and GDR bus. Further, an alternative configuration may be to transmit data on the True side by changing the number of inverters placed in the GDRF bus. Further, the encode unit and decode unit may be modified so as to perform a desired operation in such an event.

Figure 7:
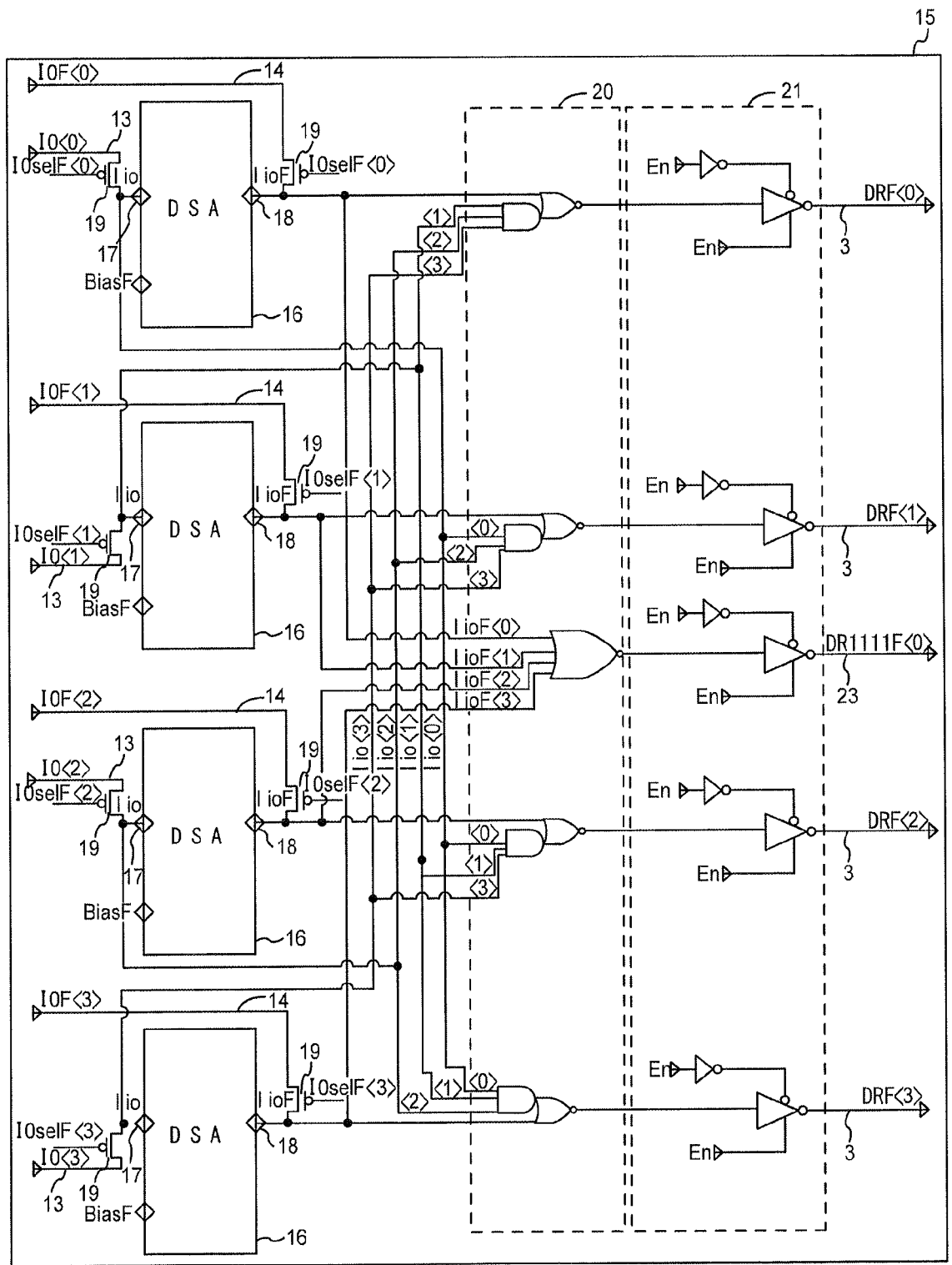
FIG. 7 is a diagram showing another embodiment of a data sense amplifier unit that can be used in the semiconductor storage apparatus embodiment shown in FIG. 1.

Next is a description of another second embodiment of the present invention by referring to FIGS. 6, 7 and 8.

The configuration of a semiconductor storage apparatus of this embodiment is essentially similar to that of the semiconductor storage apparatus of the embodiment shown in FIG. 1, except that the configurations of DRF bus 3 and DR1111F bus 23, and GDRF bus 6 and GDR1111F bus 24 are different.

The DR1111F bus 23 and GDR1111F bus 24 are second readout buses added anew for the purpose of reducing the number of times toggle operations of a data bus are performed at the time of a data transmission. The embodiment of FIG. 1 is configured to add one line of the DR11F bus 4 between two of the DRF buses 3 and likewise to add one line of the GDR11F bus 7 between two of the GDRF buses 6. In contrast, the embodiment of FIGS. 6-8 is configured to add one line of the DR1111F bus 23 for four lines of the DRF bus 3 and likewise one line of the GDR1111F bus 24 for four lines of the GDRF bus 6.

One line of the DR1111F bus 23 is added between the four lines of the DRF bus 3. The DR1111F bus 23 is configured to perform a toggle operation only if the entirety of four DRF buses 3 would be necessary to perform the toggle operation if the data transmission were performed in the conventional system. Further, the configuration is such that none of the four DRF buses 3, which would have conventionally performed the toggle operation, performs a toggle operation in such an event.

Likewise for the GDRF bus 6, one line of the GDR1111F bus 24 is added between the four lines of GDRF bus 6. The GDR1111F bus 24 is configured to perform a toggle operation only if the entirety of four GDRF buses 6 would be necessary to perform the toggle operation if the data transmission were performed in the conventional system. Further, the configuration is such that none of the four GDRF buses 6, which would have conventionally performed the toggle operation, performs a toggle operation in such an event.

In the semiconductor storage apparatus of the embodiment of FIGS. 6-8, the method for reading data (i.e., the sensing method) is the same as in the embodiment of FIGS. 1-5. That is, a series of operations starting from the sense amplifier unit 12 detecting data to the data sense amplifier block 16 of the data sense amplifier unit 15 amplifying the data, by way of the IO bus 13 and IOF bus 14, in order to read the data from a memory cell within the memory cell unit 11 of the array block 2 is similar to that of the embodiment of FIGS. 1-5, and therefore the description is not provided here.

The semiconductor storage apparatus according to the embodiment of FIGS. 6-8 implements the conversion into the second data shown in FIG. 6 by means of the encode unit 20 used in the data sense amplifier unit 15 shown in FIG. 7, thereby attaining a reduction of the power consumption.

FIG. 6 is a diagram showing data transmitted in, and power consumption of, a semiconductor storage apparatus according to this embodiment.

The IO<3:0> indicates the data input into the IO bus 13. The "3:0" means a total of four bits from the third bit to zeroth bit. FIG. 6 shows what state the potential of the DRF bus 3 is in (i.e., a High state or a toggle operation) when the data input into the IO bus 13 is transmitted on the DRF bus 3. The IO<0>, IO<1>, IO<2> and IO<3> shown in FIG. 7 correspond to the IO<3:0> shown in FIG. 6.

First, in the conventional semiconductor storage apparatus, if "0" is input into the IO bus 13, the DRF bus 3 maintains a High state, while if "1" is input into the IO bus 13, the DRF bus 3 needs to perform a toggle operation. Because of this, the maximum number of times toggles can be performed for one data transmission is four in the case of transmitting the data of "1111b". Further, the total number of times toggles are performed for transmitting sixteen kinds of data is thirty two times, and therefore the average number of times toggles are performed for a data transmission is two times (i.e., 32 times/ 16 kinds).

In contrast, the semiconductor storage apparatus according to the embodiment of FIGS. 6-8 is configured to place an additional one line of the DR1111F bus 23 for four lines of the DRF bus 3 and to have the DRF bus 3 and DR1111F bus 23 perform the toggle operation as shown in the following.

The DR1111F bus 23 is placed between four lines of the DRF bus 3. The DR1111F bus 23 is configured to perform a toggle operation only if the entirety of the four DRF buses 3 would be necessary to perform the toggle operation if the data transmission were performed in the conventional system. Further, the configuration is such that none of the four DRF buses 3, which would have conventionally performed the toggle operation, performs a toggle operation in such an event.

Note that the GDRF bus 6 and GDR1111F bus 24 are placed in the same manner as the DRF bus 3 and DR1111F bus 23, and the data is transmitted so as to likewise reduce the number of times toggle operations are performed.

That is, the configuration is such that only if the data of "1111b" is input into the IO bus 13, the DR1111F bus 23 is made to perform a toggle operation, otherwise, the DR1111F bus 23 is maintained at the High state. Meanwhile, if the data of "1111b" is input into the IO bus 13, the DRF bus 3 is made to not perform a toggle operation. The operation remains unchanged from the conventional system if other pieces of data are input into the IO bus 13. That is, when the data of "1111b" is input into the IO bus 13, a single DR1111F bus 23 is made to perform a toggle operation, in place of making four lines of the DRF bus 3 perform it.

By making the DRF bus 3 and DR1111F bus 23 perform the toggle operation, the maximum number of times toggles can be performed for one data transmission is three in the case of transmitting the data of "1110b", "1101b", "1011b" and "0111b". Further, the total number of times toggles are performed for transmitting sixteen kinds of data is twenty nine, and therefore the average number of times toggles are performed is 1.8125 (i.e., 29 times/16 kinds).

That is, in the semiconductor storage apparatus according to the embodiment of FIGS. 6-8, the maximum number of times toggles can be performed is reduced from four to three times for one data transmission and therefore the power consumption at the maximum power consumption is reduced by 25%.

Further, in the semiconductor storage apparatus according to the embodiment of FIGS. 6-8, the average number of times toggles are performed is reduced from two to 1.8125 times and therefore the power consumption at the average power consumption is reduced by about 9%.

Next is a description of a method for implementing such a toggle operation, referring to FIG. 7.

An encode unit 20 according to the embodiment shown in FIGS. 6-8 can be implemented by connecting an AND circuit and a NOR circuit as shown in FIG. 7. The circuit shown in FIG. 7 is just an example and may be freely modified so as to perform a desired operation.

The outputs of the five logic circuits drawn from the top of FIG. 7 are respectively connected to the DRF<0>, which is the zeroth bit (the first line) of the DRF bus 3, to the DRF<1>, which is the first bit (the second line) of the DRF bus 3, to the DR1111F<0>, which is the zeroth bit of the DR1111F bus 23, to the DRF<2>, which is the second bit (the third line) of the DRF bus 3, and to the DRF<3>, which is the third bit (the fourth line) of the DRF bus 3.

Next is a description of the operation of the logic circuit on the first row from the top. The NOR circuit on the first row receives an input of the zeroth bit (the first line), i.e., LIOF<0>, of the IOF bus 14 (i.e., the LIOF node 18), and an input of the AND calculation result of the first, second and third bits (the second, third, and fourth lines), i.e., LIO<1>, LIO<2> and LIO<3>, respectively, of the IO bus 13 (i.e., the LIO node 17).

As a result, if the AND of the LIO<1>, LIO<2> and LIO<3> is "0", that is, if either of them is "0", then the zeroth bit output of the IOF bus 14, that is, a toggle operation corresponding to "0" or a High state corresponding to "1", is transmitted as is to the DRF bus 3. In other words, the DRF bus 3 is made to perform a toggle operation if the IOF bus 14 is "0", while the DRF bus 3 is maintained at the High state if the IOF bus 14 is "1".

In contrast, if the AND of the LIO<1>, LIO<2> and LIO<3> is "1", that is, if all of them are "1", then the DRF bus 3 is maintained at the High state regardless of whether the IOF bus 14 is "0" or "1". That is, the state expressed by a toggle operation is not transmitted.

This configuration makes it possible to have the DRS bus 3 perform a toggle operation by transmitting the toggle operation of the IOF bus 14 if data other than "1111 b" is input into the IO bus 13, and to have the DRS bus 3 not perform a toggle operation if the data of "1111b" is input into the IO bus 13.

Note that the operations of the logic circuits on the second, fourth and fifth rows from the top are the same as that of the logic circuits on the first row from the top, and therefore the description is not provided here.

Next is a description of the logic circuit on the third row from the top. The NOR circuit that is the logic circuit on the third row from the top receives an input of the zeroth bit through third bit (the first through fourth line), i.e., LIOF<0>, LIOF<1>, LIOF<2> and LIOF<3>, of the IOF bus 14 (i.e., the LIOF node 18).

As a result, only if "0" is input into the LIOF<0>, LIOF<1>, LIOF<2> and LIOF<3>, resulting in having them perform toggle operations, is the DR1111F bus 23 made to perform a toggle operation. This configuration makes it possible to have the DR1111F bus 23 perform the toggle operation if "1111b" is input into the IO bus 13.

Note that the configuration and operation of the data sense amplifier block 16 and data sense amplifier selection unit 21 comprised by the data sense amplifier unit 15 are the same as those of the first embodiment and therefore the description is not provided here.

The configuration and operation of the encode unit 20 shown in FIG. 7 as described above make it possible to implement a conversion of data shown in FIG. 6 and to reduce the number of times toggle operations are performed at the time of a data transmission. Therefore, the configuration enables the accomplishment of a reduction in the power consumption of the semiconductor storage apparatus.

Further, the encode unit 20 of the semiconductor storage apparatus according to the second embodiment of the present invention does not have an increased number of gate stages when compared to the conventional encode unit. That is, the conventional encode unit is configured to replace the logic circuit part of FIG. 7 with an inverter circuit, and therefore comparably with it, the encode unit 20 according to the second embodiment of the present invention does not have an increased number of gate stages. Therefore, the encode unit 20 is characterized as having almost no speed penalty and allowing no delay in the transmission speed when compared with the conventional data transmission.

FIG. 8 is a diagram showing the decode unit 22 of the semiconductor storage apparatus according to the embodiment of the present invention shown in FIGS. 6 and 7. The circuit shown in FIG. 8 is just an example, and it may be freely modified so as to perform a desired operation.

The data output from the data sense amplifier block 16 within the data sense amplifier unit 15 of the array block 2 is encoded as shown in FIG. 6 by way of the encode unit 20 and data sense amplifier selection unit 21 as described above, and then transmitted to the DRF bus 3 and DR1111F bus 23. Then, the data is transmitted to the GDRF bus 6 and GDR1111F bus 24 by way of the data multiplexer unit 5. Thusly transmitted data is eventually received by the latch multiplexer unit 8 and further sent to the DQ buffer unit 9.

The decode unit 22 is included in the latch multiplexer unit 8.

The decode unit 22 comprised by the semiconductor storage apparatus according to the second embodiment of the present invention has the function of decoding, i.e., converting the second data, which has been encoded by the encode unit 20 and transmitted by way of the DRF bus 3, DR1111F bus 23, GDRF bus 6 and GDR1111F bus 24, into data of the original state (the first data, i.e., the data prior to being encoded) indicated by a toggle operation. The decode unit 22 also has a function of latching and outputting the data.

The data of the GDRF bus 6 and GDR1111F bus 24 is input into the NAND flip-flop circuits (latch circuits) as shown in FIG. 8. The NAND flip-flop circuit in the first row from the top of the drawing receives an input of the zeroth bit (the first line), i.e., GDRF<0>, of the GDRF bus 6 and the zeroth bit, i.e., GDR1111F<0>, of the GDR1111F bus 24. Of them, when the GDR1111F<0> is in the High state, the data is output by transmitting the information expressed by the toggle operation if the GDRF<0> is a toggle operation. In contrast, when the GDR1111F<0> is in the state of a toggle operation, the data is output by transmitting the information expressed by the toggle operation regardless of the state of the GDRF<0>.

In other words, if at least either the GDRF<0> or GDR1111F<0> is in the state of a toggle operation, the data is output by transmitting the state expressed by the toggle operation. In this event, the output side D<0> of the decode unit 22 uses the True side, in place of the False side, as output, and therefore the D<0> is "1" if the state expressed by a toggle operation is transmitted.

Note that the operations of the NAND flip-flop circuits on the second, third and fourth rows from the top are similar to the operation of the above described NAND flip-flop circuit on the first row from the top, and therefore the description is not provided here.

The operation as described above makes it possible to convert the data, which has been transmitted by way of the DRF bus 3, DR1111F bus 23, GDRF bus 6 and GDR1111F bus 24, into data in the state expressed by the toggle operation prior to being encoded.

The semiconductor storage apparatus according to the second embodiment of the present invention is configured to input a control signal called "inSel" from the state machine into the decode unit 22, thereby latching the data, and to input a control signal called "Outsel", thereby outputting the data.

Because of this, the decode unit 22 shown in FIG. 8 is comprising the NAND flip-flop circuit for latching the data.

Further, an input of a control signal called "rst", for resetting data, into the decode unit 22 from the state machine initiates the operation of resetting the latched data.

The decode unit 22 shown in FIG. 8 does not have an increased number of gate stages when compared to the conventional decode unit. That is, the conventional decode unit is configured to have two inputs in the NAND constituting the NAND flip-flop circuit shown in FIG. 8. While the decode unit 22 shown in FIG. 8 is different from the conventional decode unit because it has three inputs in the NAND, it does not have an increased number of gate stages. Therefore, the decode unit 22 is characterized as having a reduced speed penalty and reduced occurrence of delays in transmission speed when compared to the conventional data transmission.

Note that the second embodiment of the present invention is described by exemplifying a configuration of adding one line of the DR1111F bus 23 for four lines of the DRF bus 3 and one line of the GDR1111F bus 24 for four lines of the GDRF bus 6; the number of lines of the DR1111F bus and GDR1111F bus to be added for the number of lines of the DRF bus and GDRF bus, respectively, however, may be freely changed, in lieu of being limited to the numbers exemplified in the present embodiment. Further, the configurations and functions of the encode unit and decode unit may freely modified in association with this. It is possible to change the number of lines of the DR1111F bus and GDR1111F bus to be added in accordance with an increasable area size.

Figure 10:
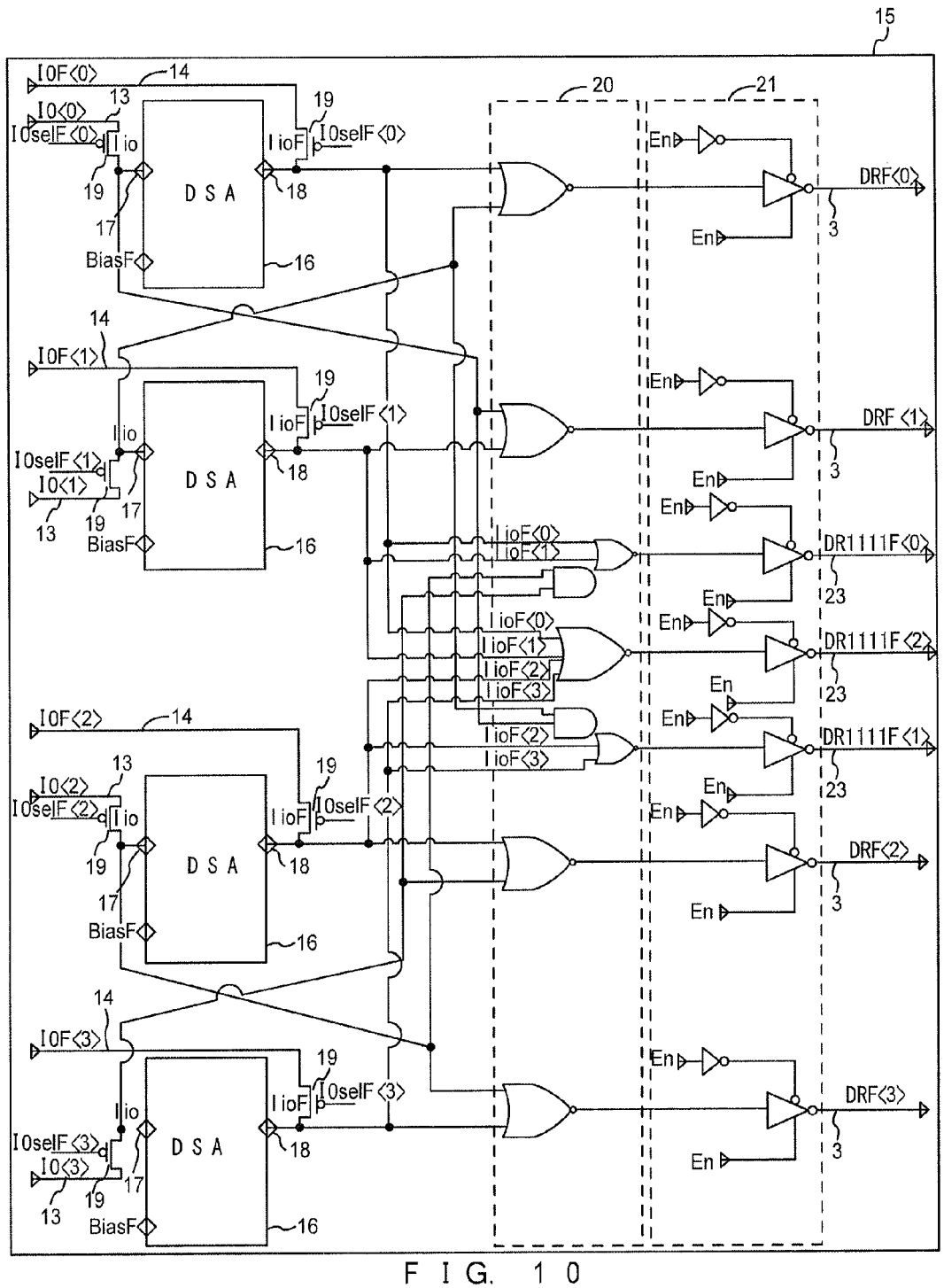
FIG. 10 is a diagram showing another embodiment of a data sense amplifier unit that can be used in the semiconductor storage apparatus embodiment shown in FIG. 1.

Next is a description of another embodiment of the present invention by referring to FIGS. 9, 10 and 11.

The configuration of a semiconductor storage apparatus according to the embodiment of FIGS. 9-11 is essentially similar to the semiconductor storage apparatus according to the embodiment shown in FIGS. 1-5, except that the configurations of DRF bus 3 and DR1111F bus 23, and GDRF bus 6 and GDR1111F bus 24, which are placed for transmitting data, are different.

The DR1111F bus 23 and GDR1111F bus 24 are a second readout bus added anew for the purpose of reducing the number of times toggle operations of a data bus are performed at the time of a data transmission. The first embodiment is configured to add one line of the DR11F bus 4 for, and between, two lines of the DRF bus 3, and likewise to add one line of the GDR11F bus 7 for, and between, two lines of the GDRF bus 6.

In contrast, the embodiment shown in FIGS. 9-11 is configured to add three lines of the DR1111F bus 23 for, and between, the DRF bus 3 and likewise to add three lines of the GDR1111F bus 24 for, and between, four lines of the GDRF bus 6.

Further, specifically, one line of DR1111F<0> as the zeroth bit (the first line) of the DR1111F bus 23 is added for the group of the zeroth bit (the first line) of the DRF bus 3 and the first bit (the second line) thereof, and one line of DR1111F<1> as the first bit (the second line) of the DR1111F bus 23 is added for the group of the second bit (the third line) of the DRF bus 3 and third bit (the fourth line) thereof. Further, one line of DR1111F<2> as the second bit (the third line) of the DR1111F bus 23 is added for the zeroth, first, second and third bits (the first, second, third and fourth lines) of the DRF bus. That is, a total of three lines of the DR1111F bus 23 are added for the placements of four lines of the DRF bus 3.

With such a configuration, the DR1111F<0> that is the zeroth bit of the DR1111F bus 23 placed between the zeroth bit and first bit of the DRF bus 3 is made to perform a toggle operation only in the case in which the aforementioned two bits would be necessary to perform the toggle operation if the data transmission were performed in the conventional system. Further, the DR1111F<1>, which is the first bit of the DR1111F bus 23 placed between the second bit and third bit of the DRF bus 3, is made to perform a toggle operation only in the case in which the aforementioned two bits would be necessary to perform the toggle operation if the data transmission were performed in the conventional system. Further, the configuration is such that the DRF buses 3 on both sides, which would have conventionally been made to perform a toggle operation, are not to perform the operation in this event.

Further, the DR1111F<2>, which is the second bit of the DR1111F bus 23, is made to perform a toggle operation only if there would be a necessity of making all of the four lines of the DRF bus 3, i.e., from the zeroth bit to the third bit, perform the toggle operation if the data transmission were performed in the conventional system. Further, the configuration is such that neither the DR1111F<0> or DR1111F<1>, nor DRF bus 3, all of which would have conventionally been made to perform a toggle operation, is made to perform the operation in this event.

Further, as with the GDRF bus 6, three lines of the GDR1111F bus 24 are added between the four lines of the GDRF bus 6. Such a configuration reduces the number of toggle operations in a method similar to the case of the DRF bus 3 and DR1111F bus 23.

In the semiconductor storage apparatus according to the embodiment FIGS. 9-11, the data readout method (i.e., the sensing method) is similar to the case of the first embodiment. That is, the series of operations starting from the sense amplifier unit 12 detecting data to the data sense amplifier block 16 of the data sense amplifier unit 15 amplifying the data by way of the IO bus 13 and IOF bus 14 in order to read the data from a memory cell within the memory cell unit 11 of the array block 2 are similar to that of the embodiment of FIGS. 1-5, and therefore their descriptions are not provided here.

The semiconductor storage apparatus according to the embodiment of FIGS. 9-11 is configured to implement a conversion to the second data as shown in FIG. 9 by means of the encode unit 20 shown in FIG. 10 and to accomplish a reduction of the power consumption.

FIG. 9 is a diagram showing data transmitted in, and power consumption of, the semiconductor storage apparatus according to the third embodiment of the present invention.

The IO<3:0> expresses the data input into the IO bus 13. The "3:0" means a total of four bits from the third bit to zeroth bit. FIG. 9 shows the state (i.e., a High state or a toggle operation) of the potential of the DRF bus 3 when the data input into the IO bus 13 is transmitted on the DRF bus 3. The IO<0>, IO<1>, IO<2> and IO<3> shown in FIG. 10 correspond to the IO<3:0> shown in FIG. 9.

First, as described for the case of FIG. 6, in the conventional semiconductor storage apparatus, if "0" is input into the IO bus 13, the DRF bus 3 is maintained in the High state, while if "1" is input into the IO bus 13, then the DRF bus 3 needs to perform a toggle operation. Therefore, the maximum number of times toggles can be performed for one data transmission is four times, which is the number for transmitting the data of "1111b". Further, the total number of times toggles are performed for transmitting sixteen kinds of data is thirty two times, and hence the average number of times toggles are performed is two (i.e., 32 times/16 kinds).

Comparably, the semiconductor storage apparatus according to the embodiment of FIGS. 9-11 is configured to add an additional three lines of the DR1111F bus 23 for four lines of the DRF bus 3, and to make the DRF bus 3 and DR1111F bus 23 perform a toggle operation as shown in the following.

First, the configuration makes the bus of the DR1111F<2> perform a toggle operation only if the data of "1111b" is input into the IO bus 13, and to otherwise make it maintain the High state.

Further, the configuration makes the bus of the DR1111F<0> perform a toggle operation only if both of the buses of the DRF<0> and DRF<1> would be required to perform a toggle operation if the data transmission were performed in the conventional system, and if neither the DRF<0> or DRF<1> is to perform a toggle operation in this event. If other data is input into the IO Bus 13, the DR1111F<0> is to maintain the High state.

Further, the bus of the DR1111F<1> is made to perform a toggle operation only if both of the buses of DRF<2> and DRF<3> would be required to perform a toggle operation if the data transmission were performed in the conventional system, and if neither the DRF<2> and DRF<3> is to perform a toggle operation in this event. If other data is input into the 10 Bus 13, the DR1111F<1> is to maintain the High state.

Here, if the DR1111F<2> is made to perform a toggle operation, neither the DR1111F<0> and DR1111F<1> is to perform a toggle operation.

Note that the GDRF bus 6 and GDR1111F bus 24 are placed in the same manner as the DRF bus 3 and DR1111F bus 23, and the number of times toggle operation is performed is reduced in a similar manner, and the data is transmitted.

The performing of the toggle operation of the DRF bus 3 and DR1111F bus 23 as described above makes the maximum number of times toggles are performed for one data transmission be two in the case of transmitting the data of "0101b", "1010b", "0110b", "0111b", "1001b", "1011b", "1101b" and "1110b". Further, the total number of times toggles are performed for transmitting sixteen kinds of data is twenty three, and therefore the average number of times toggles are performed is 1.4375 times (i.e., 23 times/16 kinds).

That is, in the semiconductor storage apparatus according to the third embodiment of the present invention, the maximum number of times toggles are performed is reduced from four to two times for one data transmission and therefore the power consumption at the maximum power consumption is reduced by 50%.

Further, in the semiconductor storage apparatus according to the embodiment of FIGS. 9-11, the average number of times toggles are performed is reduced from two to 1.4375 times and therefore the power consumption at the average power consumption is reduced by about 28%.

Next is a description of a method for implementing such a toggle operation by referring to FIG. 10.

The encode unit 20 according to the embodiment of FIGS. 9-11 used in the data sense amplifier unit 15 can be implemented by using an AND circuit and a NOR circuit as shown in FIG. 10. The circuit shown in FIG. 10 is just an example and it may be freely modified so as to perform a desired operation.

The outputs of seven logic circuits shown in the encode unit 20 of FIG. 10, starting from the top row thereof, are respectively connected to the DRF<0> and the DRF<1>, which are respectively the zeroth bit and the first bit (the first and the second line) of the DRF bus 3, the DR1111F<0>, which is the zeroth bit (the first line) of the DR1111F bus 23, the DR1111F<2>, which is the second bit (the third line) of the DR1111F bus 23 and the DR1111F<1>, which is the first bit (the second line) of the DR1111F bus 23; and then to the DRF<2> and the DRF<3>, which are second bit and the third bit (the third and the fourth line) of the DRF bus 3.

Note that the operations of the NOR circuits on the first and second rows from the top are similar to those of the NOR circuits on the top row and bottom row of FIG. 3, and therefore the description is not provided here.

Further, the operations of the NOR circuits on the sixth row and seventh row from the top are similar to those of the NOR circuits on the top row and bottom row of FIG. 3, and therefore the description is not provided here.

The configuration of such a circuit transmits the zeroth bit output of the IOF bus 14 as is to the DRF bus 3 if the LIO<1> is "0" in the case of, for example, the NOR circuit shown in the first row from the top. That is, if the IOF bus 14 is "0", the DRF bus 3 is made to perform a toggle operation, while if the IOF bus 14 is "1", the DRF bus 3 is maintained in the High state.

In contrast, if the LIO<0> is "1", the DRF bus 3 is maintained in the High state regardless of the IOF bus 14 being "0" or "1". That is, the state expressed by the toggle operation is not transmitted.

Next is a description of an operation of the logic circuit in the third row from the top. The NOR circuit in the third row from the top receives an input of the zeroth bit, i.e., LIOF<0>, and the first bit, i.e., LIOF<1>, of the IOF bus 14 (i.e., the LIOF node 18), and that of the AND calculation result of LIO<2> and LIO<3> that are the second and third bits of the IO bus 13 (i.e., the LIO node 17). As a result, when at least either the LIO<2> or LIO<3> is "0", and if both the LIOF<0> and LIOF<1> are toggle operations, the state expressed by the toggle operation is transmitted to the DR1111F<0>, thereby making it perform the toggle operation.

In contrast, when the AND of the LIO<2> and LIO<3> is "1", that is, when both of them are "1", the bus of the DR1111F<0> is maintained at the High state regardless of the states of the LIOF<0> and LIOF<1>. That is, the state expressed by the toggle operation is not transmitted.

This configuration makes it possible to control the DR1111F<0> so as not to perform a toggle operation if "1111b" is input into the IO bus 13; in other cases, if "1" is input into both of the zeroth bit and first bit of the IO bus 13 to control the DR1111F<0>, then this configuration makes it possible to perform a toggle operation.

Note that the operation of the logic circuit in the fifth row from the top is similar to that of the above described logic circuit in the third row from the top, and therefore the description is not provided here.

Next is a description of the logic circuit in the fourth row from the top. The NOR circuit that is the logic circuit in the fourth row from the top receives an input of the LIOF<0>, LIOF<1>, LIOF<2> and LIOF<3> of the zeroth bit through the third bit of the IOF bus 14 (i.e., the LIOF node 18).

As a result, only if "0" is input into the LIOF<0>, LIOF<1>, LIOF<2> and LIOF<3>, thus requiring a toggle operation, is the second bit of the DR1111F bus 23, i.e., DR1111F<2>, made to perform the toggle operation.

This configuration makes it possible to make the second bit of the DR1111F bus 23, i.e., DR1111F<2>, perform the toggle operation, if data of "1111b" is input into the IO bus 13.

Note that the configuration and operation of the data sense amplifier block 16 and data sense amplifier selection unit 21, which are included in the data sense amplifier unit 15 shown in FIG. 11, are similar to those of the embodiment of FIGS. 1-5, and therefore the description is not provided here.

The configuration and operation of the encode unit 20 shown in FIG. 10 enables an implementation of the conversion of data as shown in FIG. 9 and a reduction in the number of times toggle operations of a bus are performed at the time of a data transmission. It accordingly enables the accomplishment of a reduction in the power consumption of the semiconductor storage apparatus.

Further, the encode unit 20 comprised by the semiconductor storage apparatus according to the embodiment of FIGS. 9-11 does not have an increased number of gate stages as compared to the conventional encode unit. That is, the conventional encode unit is configured such that the logic circuit part of FIG. 10 is replaced with an inverter circuit, whereas, in comparison, the encode unit 20 according to the embodiment of FIGS. 9-11 does not have an increased number of gate stages. Therefore, the encode unit 20 is characterized as having reduced penalty in terms of speed as compared to the conventional data transmission and as allowing reduced delay in the transmission speed.

FIG. 11 is a diagram showing a decode unit 22 used in the data sense amplifier 15 of the semiconductor storage apparatus according to the embodiment of FIGS. 6-9. The circuit shown in FIG. 11 is an example and it may be freely modified so as to perform a desired operation.

The data output from the data sense amplifier block 16 within the data sense amplifier unit 15 of the array block 2 is encoded as shown in FIG. 9 by way of the encode unit 20 and data sense amplifier selection unit 21 as described above, and then transmitted to the DRF bus 3 and DR1111F bus 23. Then, the data is transmitted to the GDRF bus 6 and GDR1111F bus 24 by way of the data multiplexer unit 5. Thusly transmitted data is eventually received by the latch multiplexer unit 8 and further sent to the DQ buffer unit 9.

The decode unit 22 comprised by the semiconductor storage apparatus according to the embodiment of FIGS. 9-11 has the function of decoding, i.e., converting the second data, which has been encoded by the encode unit 20 and transmitted by way of the DRF bus 3, DR1111F bus 23, GDRF bus 6 and GDR1111F bus 24, into data of the original (the first data, i.e., the data prior to being encoded) state indicated by a toggle operation. The decode unit 22 also has a function of latching and outputting the data.

The data of the GDRF bus 6 and GDR1111F bus 24 is input into the NAND flip-flop circuits (latch circuits) as shown in FIG. 11. The NAND flip-flop circuit on the first row from the top of the drawing receives an input of the zeroth bit (the first line), i.e., GDRF<0>, of the GDRF bus 6, and the zeroth bit and second bit (the first and the third line), i.e., GDR1111F<0> and GDR1111F<2>, of the GDR1111F bus 24. Of them, when both of the GDR1111F<0> and GDR1111F<2> are in the High state, the data is output by transmitting the information expressed by the toggle operation if the GDRF<0> is a toggle operation. In contrast, when at least either the GDR1111F<0> or GDR1111F<2> is in the state of a toggle operation, the data is output by transmitting the information expressed by the toggle operation regardless of the state of the GDRF<0>.

In other words, if at least either the GDRF<0>, GDR1111F<0> or GDR1111F<2> is "0", that is, if performing a toggle operation, the data is output by transmitting the state expressed by the toggle operation. In this event, the output side D<0> of the decode unit 22 uses the True side, in place of the False side, as output, and therefore the D<0> is "1" if the state expressed by a toggle operation is transmitted.

Note that the operations of the NAND flip-flop circuits on the second, third and fourth rows from the top are also similar to the operation of the above described NAND flip-flop circuit on the first row from the top, and therefore the description is not provided here.

The operation as described above makes it possible to convert the data, which has been transmitted by way of the DRF bus 3, DR1111F bus 23, GDRF bus 6 and GDR1111F bus 24, into data in the state expressed by the toggle operation prior to being encoded.

The semiconductor storage apparatus according to the embodiment of FIGS. 9-11 is configured to input a control signal called "inSel" from the state machine to the decode unit 22, thereby latching the data, and to input a control signal called "Outsel", thereby outputting the data. Because of this, the decode unit 22 shown in FIG. 11 is comprising the NAND flip-flop circuit for latching the data.

Further, an input of a control signal called "rst", for resetting data, to the decode unit 22 from the state machine initiates the operation of resetting the latched data.

Further, in FIG. 11, the decode unit 22 of the semiconductor storage apparatus according to the embodiment of FIGS. 9-11 does not have an increased number of gate stages when compared to the conventional decode unit. That is, the conventional decode unit is configured to have two inputs in the NAND constituting the NAND flip-flop circuit shown in FIG. 11. While the decode unit 22 according to the third embodiment of the present invention is different from the conventional decode unit because it has four inputs in the NAND, it does not have an increased number of gate stages. Therefore, the decode unit 22 is characterized as having a reduced speed penalty and reduced occurrence of a delay in transmission speed when compared to the conventional data transmission.

Figure 12:
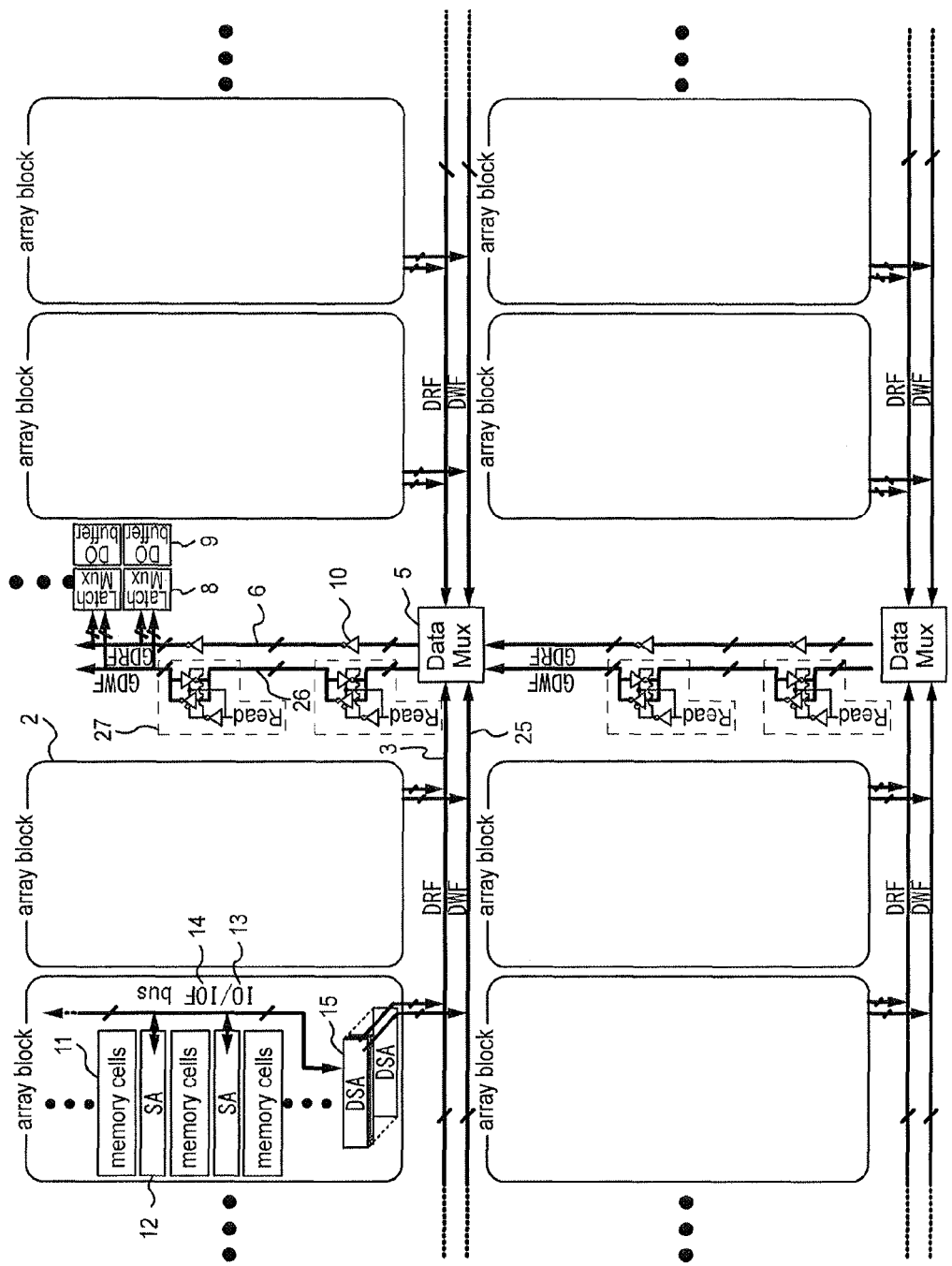
FIG. 12 is a block diagram of a semiconductor storage apparatus according to another embodiment of the present invention.
Figure 13:
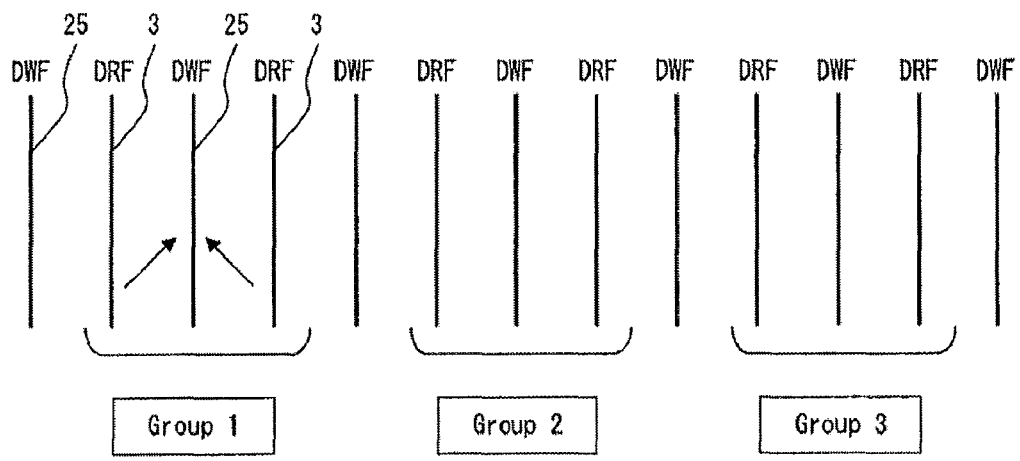
FIG. 13 is a diagram showing a placement of data buses of a semiconductor storage apparatus according to the embodiment shown in FIG. 12.

Next is a description of a semiconductor storage apparatus according to another embodiment of the present invention, referring to FIGS. 12 and 13.

FIG. 13 is a diagram showing a placement of data buses of the semiconductor storage apparatus according to the fourth embodiment of the present invention.

The configuration of the semiconductor storage apparatus according to the embodiment of FIGS. 12 and 13 is essentially similar to that of the semiconductor storage apparatus according to the embodiment shown in FIG. 1. The difference, however, lies in the DRF bus 3 and a Data Write False (DWF) bus 25, and the GDRF bus 6 and a Global Data Write False (GDWF) bus 26, which are for transmitting data.

That is, the embodiment shown in FIG. 1 is configured to add the DR11F bus 4, as the second readout bus, to the DRF bus 3, and further add the GDR11F bus 7, as the second read out bus, to the GDRF bus 6. In contrast, the embodiment of FIGS. 12 and 13 is characterized as utilizing the DWF bus 25 and GDWF bus 26 as bidirectional buses, which are write buses originally equipped for data writing, instead of adding a bus anew.

Commonly, the DRF bus 3 and DWF bus 25 of a semiconductor storage apparatus are placed alternately for the purpose of providing a shield. That is, if the first line and third DRF buses 3 are made to perform the toggle operation at the time of reading data, a variation of the potential as a result of the second DRF bus 3 that exists between the aforementioned buses being influenced by a coupling constitutes a cause for a data error, and therefore a countermeasure is taken as described in the following. That is, the DWF buses 25 are pre-placed between the respective DRF buses 3, and the DWF buses 25 are maintained at the potential of the ground or Vcc during data readout. Since the data readout and write does not occur simultaneously, the design is such that the write-use DWF bus 25 functions as a shield at the time of reading data, and the readout-use DRF bus 3 functions as a shield at the time of writing data, thereby reducing errors at the time of a data transfer.

The semiconductor storage apparatus according to the embodiment of FIGS. 12 and 13 is configured to place the DRF bus 3 and DWF bus 25, and the GDRF bus 6 and GDWF bus 26, all in parallel as shown in FIG. 13, and to use the DWF bus 25 and GDWF bus 26 for the purpose of reducing the number of times toggle operations of a data bus are performed at the time of a data transmission.

That is, the DWF bus 25 is used in place of the DR11F bus 4 and the GDWF bus 26 in place of the GDRF bus 6 of the semiconductor storage apparatus according to the embodiment of FIG. 1.

GDWF bus control units 27 are equipped in certain places of the GDWF bus 26. The semiconductor storage apparatus according to the fourth embodiment of the present invention is capable of utilizing the GDWF bus 26 for a bidirectional transmission by virtue of the GDWF bus control unit 27.

For example, in the case of performing a readout operation, the GDWF bus control unit 27, receiving an input of a Read signal from the state machine, drives the GDWF bus 26 in the same direction as the GDRF bus 6 and controls so as to drive it reversely in the write direction. This configuration makes it possible to use the GDWF bus 26 for transmitting data in the direction of reading.

For example, in the case of performing a write operation, the GDWF bus control unit 27, not receiving an input of a Read signal from the state machine, does not drive the GDWF bus 26 in the same direction as the GDRF bus 6. This configuration makes it possible to use the GDWF bus 26 for transmitting data in the direction of writing.

Except for the above description, the configuration, operation and function of the semiconductor storage apparatus according to the fourth embodiment are similar to the configuration, operation and function of the semiconductor storage apparatus according to the embodiment shown in FIG. 1, and therefore the description is not provided here.

Further, the configuration, operation and function of the encode unit and decode unit comprised by the semiconductor storage apparatus according to the embodiment of FIGS. 12 and 13 are similar to the configuration, operation and function of the encode unit and decode unit of the semiconductor storage apparatus according to the embodiment shown in FIGS. 3 and 5, and therefore the description is not provided here.

Meanwhile, the description of the conversion into the second data performed to reduce the number of times toggle operations are performed and of the power consumption reduced as a result of the conversion is similar to the case of the first embodiment of the present invention (refer to FIG. 4) and therefore the description is not provided here.

The configuration of the semiconductor storage apparatus as described above reduces the number of toggle operations of the DRF bus and GDRF bus without adding a data bus anew, that is, enlarging the chip area very little, if at all, thereby enabling a reduction in the power consumption of the semiconductor storage apparatus at the time of transmitting data.

As such, the configuration of the semiconductor storage apparatus as described above in detail utilizes a data bus other than the readout use data bus for a data transmission, thereby making it possible to reduce the number of times toggle operations are performed, and to reduce the power consumption at the time of a data transmission when performing a readout operation.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a sense amplifier coupled to a memory array by a plurality of I/O busses;
a plurality of first local busses coupled to the sense amplifier;
a plurality of second local busses coupled to another memory array;
a data multiplexer coupled to the plurality of first local busses and the plurality of second local busses;
a plurality of global busses coupled to the data multiplexer and configured to provide selected signals from selected ones of the plurality of first local busses and selected ones of the plurality of second local busses; and
wherein the sense amplifier is configured to perform a toggle operation on a maximum of one-half of the plurality of first local busses to generate encoded data.

2. The apparatus of claim 1, further comprising:
a plurality of write busses coupled to the sense amplifier, wherein the plurality of write busses and the plurality of first busses are interleaved.

3. The apparatus of claim 1, wherein the sense amplifier further comprises:
an output configured to be placed at a particular impedance.

4. The apparatus of claim 1, wherein the plurality of write busses are configured to be maintained at a particular voltage responsive, at least in part, to the sense amplifier generating encoded data.

5. The apparatus of claim 1, wherein at least one of the plurality of global busses comprises a bi-directional bus.

6. The apparatus of claim 1, further comprising:
a latch multiplexer coupled to at least one of the plurality of global busses and configured to generate decoded data based, at least in part, on the encoded data.

7. The apparatus of claim 1, wherein a toggle operation comprises driving at least one of the plurality first busses to a low state.

8. An apparatus, comprising:
a first bus coupled to at least one memory cell;
a sense amplifier coupled to the first bus, wherein the sense amplifier includes an encode unit configured to receive read data from the first bus, the encode unit further configured to toggle a maximum of one-half of a plurality of second busses to provide encoded data on the plurality of second busses based, at least in part, on the read data.

9. The apparatus of claim 8, wherein the sense amplifier further comprises:
a sense amplifier selection unit coupled to the plurality of second busses and configured to set an output of the encode unit at a predetermined impedance.

10. The apparatus of claim 8, wherein the sense amplifier further comprises:
a sense amplifier block coupled to the first bus and configured to amplify read data received from the first bus.

11. The apparatus of claim 8, wherein the plurality of second busses are configured to be held at a low state between readout operations.

12. The apparatus of claim 8, wherein at least one of the plurality of second busses is configured to couple read data in a first direction and couple write data in a second direction.

13. The apparatus of claim 12, wherein the at least one of the plurality of second busses includes a bus control unit configured to drive the at least one of a plurality of second busses in the first direction responsive, at least in part, to a read signal.

14. The apparatus of claim 8, further comprising:
a decoder coupled to the plurality of second busses and configured to receive the encoded data, the decoder further configured to provide output data based, at least in part, on the encoded data.

15. The apparatus of claim 14, wherein the output data and the read data comprise same values.

16. A method of outputting data, comprising:
receiving read data;
toggling a maximum of one-half of a plurality of outputs of a sense amplifier to generate encoded data responsive, at least in part, to receipt of the read data;
providing the encoded data to at least one of a plurality of busses.

17. The method of claim 16, wherein said toggling comprises:
changing a state of at least one of the plurality of busses to a high state.

18. The method of claim 16, wherein the plurality of busses comprises interleaved readout and write busses.

19. The method of claim 16, wherein the plurality of busses are global busses.

20. A method of outputting data, comprising:
receiving read data from a memory array;
toggling at least one of a plurality of bits of a first bus from a first state to a second state to generate a first set of encoded data;
providing the first set of encoded data over a first bus to a multiplexer;
selectively coupling the first set of encoded data and a second set of encoded data; and
wherein a maximum of one-half of the plurality of bits of the first bus may be toggled to generate the first set of encoded data.

21. The method of claim 20, wherein said toggling comprises:
increasing a voltage on the at least one of the plurality of bits of the first bus.

22. The method of claim 20, further comprising:
before said providing, amplifying the read data.

23. The method of claim 20, further comprising:
after said selectively coupling, decoding at least one of the first and second sets of encoded data to generate decoded data; and
providing the decoded data to a buffer.

24. The method of claim 20, wherein said providing the first set of encoded data comprises:
maintaining a write bus at a predetermined potential.

* * * * *